(12) United States Patent
Suzumura et al.

(10) Patent No.: US 7,863,162 B2
(45) Date of Patent: Jan. 4, 2011

(54) SEMICONDUCTOR DEVICE AND MANUFACTURING METHOD THEREOF

(75) Inventors: Isao Suzumura, Kokubunji (JP); Katsuya Oda, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 673 days.

(21) Appl. No.: 11/329,107

(22) Filed: Jan. 11, 2006

(65) Prior Publication Data

US 2006/0154450 A1     Jul. 13, 2006

(30) Foreign Application Priority Data

Jan. 12, 2005   (JP) .............................. 2005-004744

(51) Int. Cl.
*H01L 21/20* (2006.01)
(52) U.S. Cl. ................... 438/478; 438/507; 438/479; 438/716; 438/464; 438/618; 438/166; 438/308; 438/487; 438/795; 257/19; 257/67; 257/69; 257/E29.193; 257/E21.134; 257/E21.347
(58) Field of Classification Search ............... 438/478
See application file for complete search history.

(56) References Cited

U.S. PATENT DOCUMENTS

| | | | |
|---|---|---|---|
| 6,905,972 B2* | 6/2005 | Oda | 438/716 |
| 7,095,043 B2* | 8/2006 | Oda et al. | 257/19 |
| 7,419,860 B2* | 9/2008 | Shinagawa et al. | 438/166 |
| 2003/0045063 A1* | 3/2003 | Oda | 438/309 |
| 2003/0181060 A1* | 9/2003 | Asai et al. | 438/758 |
| 2004/0023519 A1* | 2/2004 | Clark et al. | 438/795 |

FOREIGN PATENT DOCUMENTS

JP    2003-077844    3/2003

* cited by examiner

*Primary Examiner*—Fernando L Toledo
*Assistant Examiner*—Ankush k Singal
(74) *Attorney, Agent, or Firm*—Mattingly & Malur, P.C.

(57) ABSTRACT

A manufacturing method of a semiconductor device in which the oxygen and carbon concentrations are reduced at the interface of each layer making up the semiconductor multilayer film. A first semiconductor layer is formed on a single-crystal substrate in a first reactor; the substrate is transferred from the first reactor to a second reactor through a transfer chamber; and a second semiconductor layer is formed on the first semiconductor layer in the second reactor. During substrate transfer, hydrogen is supplied when the number of hydrogen atoms bonding with the surface atoms of the first semiconductor layer is less than the number of surface atoms of the first semiconductor layer, and the supply of hydrogen is stopped when the number of hydrogen atoms bonding with the surface atoms of the first semiconductor layer is greater than the number of surface atoms of the first semiconductor layer.

13 Claims, 21 Drawing Sheets

SEMICONDUCTOR DEVICE AND MANUFACTURING METHOD THEREOF

CLAIM OF PRIORITY

The present application claims priority from Japanese application JP 2005-004744 filed on Jan. 12, 2005, the content of which is hereby incorporated by reference into this application.

FIELD OF THE INVENTION

The present invention relates to a semiconductor device and a manufacturing method thereof, and more particularly to a manufacturing method of a semiconductor multilayer film with implementation of substrate transport.

BACKGROUND OF THE INVENTION

Recently, with the rapid development of large-capacity data transmission systems and ultra-high-speed wireless communication systems, improvement in the performance and the reduction in cost of LSIs used in them have been required. Therefore, since it has excellent operational speed and uses existing Si processes, attention has been paid to SiGe HBT technology.

In order to improve the HBT performance, achieving a step doping profile is necessary to increase the cutoff frequency. Moreover, in order to suppress the increase in the base resistance by reducing the base width, it is necessary to increase the doping concentration. However, in a conventional HBT, an emitter layer is formed by performing heat treatment at 900° C. or more and diffusing the dopant from the highly-doped n-type polycrystalline Si layer which is formed as an emitter lead layer after forming a collector and a base by epitaxial growth. Since it takes such manufacturing method, there is a problem that the base width is enlarged due to this heat treatment. Moreover, since Ge has about a 4.2% larger lattice constant than does Si, lattice strain is involved in the SiGe layer grown on a Si substrate. This caused the problem that the lattice strain is relieved by the heat treatment at high temperatures and crystallinity becomes worse through the creation of dislocations and crystal defects. With this being the situation, HBT and a manufacturing method thereof have been discussed in which an emitter layer is also formed by epitaxial growth following a base layer with the objective of forming a highly-doped and a shallow junction by controlling the diffusion of dopant and by removing the heat treatment at high temperatures in order to maintain excellent crystallinity of the epitaxial layer. JP-A No. 77844/2003 (patent document 1) is an example.

FIG. 13 is a sequence illustrating the essence of a manufacturing method of a typical semiconductor device which has been done up to now.

In this example, selective growth of a multilayer film composed of a p-type doped single-crystal SiGe layer and an n-type doped single-crystal SiGe layer is carried out inside of an opening in an insulator film provided on a Si substrate. In order to perform this, a semiconductor manufacturing apparatus having a first reactor, a second reactor, a transfer chamber, and a load-lock chamber is used, in which the reactors and the transfer chamber are under a vacuum condition of, for instance, a pressure of $1\times10^{-5}$ Pa or less. If growth of a p-type single-crystal SiGe layer is carried out in the first reactor, growth of an n-type single-crystal SiGe layer is performed in the other, second reactor.

A typical growth sequence is as follows. First of all, after mounting a Si substrate on which initial cleaning is performed in the load-lock chamber and evacuating the load-lock chamber, the Si substrate is transferred to the first reactor through the transfer chamber. After this, the Si substrate is cleaned. In this prior art, a method is disclosed as an example of cleaning, in which it is performed in hydrogen atmosphere. First, clean hydrogen gas is supplied to the first reactor (FIG. 13, step a). Here, the hydrogen gas flow rate is controlled to be 10 ml/min or more and 100 l/min or less, and the hydrogen gas partial pressure is controlled to be 10 Pa or more and atmospheric pressure or less. Next, the Si substrate is heated up to, for instance, 850° C. (step b). Then after this, the substrate is heated up and kept for a predetermined time (step c). The time is determined according to the relationship with the cleaning temperature, for instance, if it is performed at 850° C., it is 10 minuets.

When cleaning is over, the temperature of the Si substrate is decreased to the epitaxial growth temperature (step d) and the substrate temperature is continuously maintained (step e). In this step e, clean hydrogen gas is continuously supplied to the surface.

After this, selective epitaxial growth of a p-type single-crystal SiGe layer starts by stopping hydrogen gas and supplying source gas and p-type doping gas (step f). For the source gas, disilane ($Si_2H_6$) is used for Si, monogermane ($GeH_4$) for Ge, and diborane ($B_2H_6$) for the doping gas. The growth condition to form, for instance, a p-type single-crystal SiGe layer having a Ge content of 15% and a doping concentration of $1\times10^{-19}$ cm$^{-3}$ is controlled to be a growth temperature of 550° C., a growth pressure of 1 Pa, a flow rate of disilane of about 3 ml/min, a flow rate of germane of about 3 ml/min, and a flow rate of diborane diluted by hydrogen of about 40 ml/min. When the growth is terminated, supply of the growth gas and the doping gas stops, the gas is evacuated from the reactor, and the substrate temperature is decreased. At this time, clean hydrogen gas is supplied the same as in step e (step g).

When formation of a p-type single-crystal SiGe layer in the first reactor is terminated, the substrate is transferred to the second reactor through the transfer chamber in order to form an n-type single-crystal SiGe layer. Although hydrogen gas is supplied continuously from step g during the transfer, the pressures of the first reactor and of the transfer chamber are made to be almost equal while transferring. Transferring the substrate to the second reactor is carried out after making the pressures of the transfer chamber and the second reactor equal (step h).

When the set-up of the substrate in the second reactor is completed, the substrate temperature rises to a temperature for epitaxial growth under a condition where the supply of hydrogen gas is maintained (step i). At this time, although the supply condition of hydrogen is made the same as the one for cleaning the substrate surface, cleaning prior to growth of the n-type SiGe layer is not carried out because the surface of the p-type SiGe layer formed in the first reactor is kept clean. When the substrate temperature reaches the epitaxial growth temperature in the second reactor, the substrate temperature is maintained while supplying clean hydrogen gas (step j). After this, by stopping the hydrogen gas and supplying a growth gas and an n-type doping gas, selective growth of the n-type single-crystal SiGe layer is started (step k). For instance, phosphine ($PH_3$) is used for the n-type doping gas. Finally, the substrate temperature is dropped at the same time that the growth of the n-type SiGe layer is terminated by stopping the supply of gas (step 1); the substrate is transferred to the load-lock chamber through the transfer chamber, and it is taken out from the apparatus.

SUMMARY OF THE INVENTION

In a manufacturing method of a semiconductor single-crystal multilayer disclosed in prior arts, there are problems like the ones that follow because hydrogen is continuously supplied until growth of the n-type single-crystal SiGe layer is started in the second reactor after finishing the p-type single-crystal SiGe layer in the first reactor.

In epitaxial growth by a CVD technique described in prior arts, the surface of the p-type single-crystal SiGe layer is terminated by hydrogen atoms when growth is completed in the first reactor. Since the substrate is transferred while supplying hydrogen, this hydrogen-terminated surface is maintained until the next growth is started in the second reactor from the point when the growth is completed in the first reactor. However, at the hydrogen-terminated surface of the single-crystal Si layer, the structure changes if the substrate temperature is about 150° C. or more or 150° C. or less, although it depends on the hydrogen pressure. Concretely, when it is about 150° C. or more, monohydride is formed, in which one hydrogen atom bonds with one Si atom existing at surface. On the other hand, when it is about 150° C. or less, dihydride is formed, in which two hydrogen atoms bond with one Si atom. In prior arts, although hydrogen is supplied to the surface of the single-crystal SiGe layer, and not to the single-crystal Si layer, the Ge content is 15% which is less than Si. Therefore, it can be thought the same as the case of the single-crystal Si layer. Moisture and oxygen are easily adsorbed at the surface of the dihydride compared with the surface of monohydride. Even if it is under ultra high vacuum conditions, a trace of moisture and oxygen exist in the reactor and the transfer chamber. Therefore, in prior arts in which hydrogen is supplied during transfer, oxygen atoms are adsorbed at the surface when the substrate temperature is low, so that there is a problem that crystal defects are created by oxygen being taken in at the interface of the semiconductor single-crystal multilayer film.

The essence of the present invention is described as follows. A manufacturing method of a semiconductor device of the present invention comprises at least a first process for forming a first semiconductor layer on a single-crystal substrate in a first reactor, a second process for transferring the substrate after the first process from the first reactor through a transfer chamber to a reactor for growing a second semiconductor layer, and a third process for forming a second semiconductor layer after the second process in a reactor for growing the second semiconductor layer on the first semiconductor layer. And, in the second process, based on the substrate temperature at which a termination structure composed of hydrogen atoms at the surface of the first semiconductor layer changes, hydrogen is supplied in the case when the temperature is higher than the substrate temperature in question, and hydrogen stops being supplied and an ultra high vacuum condition is maintained in the case when the temperature is lower than the substrate temperature in question.

The substrate temperature in which the termination structure is changed by hydrogen atoms at the surface of the first semiconductor layer has some window according to the atmospheric hydrogen pressure, and it is a temperature in which the bonding condition of hydrogen atoms with atoms of the substrate material, for instance, Si atoms in the case of a Si substrate, changes. More concretely, it is a change where one hydrogen atom is easily bonded with one Si atom at the surface of the substrate or two atoms are easily bonded. This phenomenon is described in the section of problems to be solved by the invention.

Herein, the aforementioned second process can take various configurations. That is, a typical configuration is one where the reactor for growing the second semiconductor layer is a second reactor which is different from the first reactor. Moreover, the second process can also take a configuration in which the substrate is transferred to the transfer chamber from the first reactor after the first process and the substrate is returned to the first reactor from the transfer chamber. Furthermore, a configuration which accompanies the outline of the present invention may be taken.

Furthermore, an ultra high vacuum condition may be a vacuum condition used for substrate transfer in the field of the general crystal growth techniques in question. This is, generally speaking, about $1 \times 10^{-5}$ Pa or less in practice.

A preferable example of the present invention is described as one where the substrate temperature in the case of supplying hydrogen is 250° C. or more in the second process and one where the substrate temperature, in the case of stopping the supply of hydrogen, is in the range from 50° C. to 250° C. in the second process.

Moreover, the present invention is described from another viewpoint as a manufacturing method of a semiconductor device of the present invention comprising at least a first process for forming a first semiconductor layer on a single-crystal substrate in a first reactor, a second process for transferring the substrate after the first process from the first reactor through a transfer chamber to a reactor for growing a second semiconductor layer, and a third process for forming a second semiconductor layer after the second process in a reactor for growing the second semiconductor layer on the first semiconductor layer. And, in the second process, hydrogen is supplied when the number of hydrogen atoms bonding with the surface atoms of the first semiconductor layer is less than the number of surface atoms of the first semiconductor layer, and supply of hydrogen is stopped when the number of hydrogen atoms bonding with the surface atoms of the first semiconductor layer is greater than the number of surface atoms of the first semiconductor layer.

A more concrete example will be described as follows. That is, a first semiconductor layer is formed on a first reactor on a single-crystal substrate. After this process, the substrate is transferred to a second reactor from the first reactor through a transfer chamber, and after this process, a second semiconductor layer is formed on the first semiconductor layer in the second reactor. Moreover, in the process for transforming the substrate, hydrogen is supplied when the number of hydrogen atoms bonding with the surface atoms of the first semiconductor layer is less than the number of surface atoms of the first semiconductor layer, and the supply of hydrogen is stopped when the number of hydrogen atoms bonding with the surface atoms of the first semiconductor layer is greater than the number of surface atoms of the first semiconductor layer.

Another configuration of the manufacturing method of a semiconductor device related to the present invention is one where a first semiconductor layer is formed on a single-crystal substrate in the first reactor; the substrate is transferred after this process from the first reactor to the transfer chamber; the substrate is transferred from the transfer chamber to the first reactor after this; and a second semiconductor layer is formed after this process on the first semiconductor layer in the first reactor. Moreover, in the process for transforming the substrate transfer, hydrogen is supplied when the number of hydrogen atoms bonding with the surface atoms of the first semiconductor layer is less than the number of surface atoms of the first semiconductor layer, and the supply of hydrogen is stopped when the number of hydrogen atoms bonding with the surface atoms of the first semiconductor layer is greater than the number of surface atoms of the first semiconductor layer.

In more another configuration of a manufacturing method of a semiconductor device of the present invention, it is preferable that the temperature, at which the number of hydrogen atoms bonding with the surface atoms of the first semiconductor layer becomes less than the number of the surface atoms of said first semiconductor layer, be 250° C. or more and 500° C. or less. Moreover, in a manufacturing method of a semiconductor device of the present invention, it is preferable that the temperature, at which the number of hydrogen atoms bonding with the surface atoms of the first semiconductor layer becomes greater than the number of the surface atoms of said first semiconductor layer, be 50° C. or more and 250° C. or less.

Next, an example of a configuration of a more practical semiconductor layer, etc. of the present invention is as follows.

First, it is preferable for the manufacturing method of a semiconductor device that a highly-doped p-type single-crystal SiGe layer 9 be formed on a single-crystal Si substrate in the first reactor and a highly-doped n-type single-crystal layer 11 be formed on this highly-doped p-type single-crystal SiGe layer 9 in the second reactor as described in a growth sequence shown in FIG. 1.

In a manufacturing method of a semiconductor device of the present invention, a single-crystal substrate is typically a Si substrate and, moreover, a substrate mainly composed of Si may be used. That is, a Si substrate or a SiGe substrate is preferable. Moreover, it is needless to say that other elements may be contained if necessary.

In a manufacturing method of a semiconductor device of the present invention, it is preferable that the first semiconductor layer be Si or contain Si as the main component. Moreover, it is preferable in practice that the second semiconductor layer be Si or contain Si as the main component. Furthermore, it is a preferable example in practice if C is added to either of the first semiconducting layer or the second semiconducting layer.

In a manufacturing method of a semiconductor device of the present invention, it is preferable in practice that B be doped in the first reactor and P or As be doped in the second reactor.

Although a semiconductor material mainly composed of Si is a typical example for each of the above-mentioned semiconductor layers, a semiconductor material mainly composed of SiGe may be used. Moreover, a semiconductor material containing carbon (C) may be used for a semiconductor material mainly composed of Si. If a typical example is concretely listed, it is a Si layer, a SiGe layer, and a SiGeC layer. And it is needless to say that a p-type or an n-type dopant may be contained in these materials. A typical example of a p-type dopant is B (boron), a typical example of an n-type dopant is P (phosphorus), As (arsenic), and Sb (antimony).

Next, an example of a semiconductor device of the present invention will be described as follows. That is, the first one comprises a first conductive type first semiconductor layer formed on a single-crystal substrate in which the doping concentration is $1\times10^{19}$ cm$^{-3}$ or more, and a second conductive type second semiconductor layer formed on the first semiconductor layer having a conductive type opposite that of the first conductive type in which the doping concentration is $1\times10^{19}$ cm$^{-3}$ or more, in which both the oxygen concentration and the carbon concentration at the interface between the first semiconductor layer and the second semiconductor layer are about $1\times10^{19}$ cm$^{-3}$ or less. This example is shown in a cross-sectional structure of a SiGe HBT illustrated in FIGS. 6 and 9.

Moreover, another example is as follows. That is, the second example comprises a first conductive type first semiconductor layer formed on a single-crystal substrate in which the doping concentration is $1\times10^{19}$ cm$^{-3}$ or more, and a second conductive type second semiconductor layer formed on the first semiconductor layer having a conductive type opposite that of the first conductive type in which the doping concentration is $5\times10^{17}$ cm$^{-3}$ or less, in which both the oxygen concentration and the carbon concentration at the interface between the first semiconductor layer and the second semiconductor layer are about $1\times10^{19}$ cm$^{-3}$ or less. This example is shown in a cross-sectional structure of a MODFET illustrated in FIG. 11.

According to a manufacturing method of a semiconductor device of the present invention, a semiconductor layered product having excellent crystallinity can be achieved, thereby, excellent various characteristics of the semiconductor device using this can be ensured. Or, high performance of the semiconductor integrated circuit can be ensured.

DETAILED DESCRIPTION OF THE PREFERRED EMBODIMENTS

First Embodiment

Figure 1:
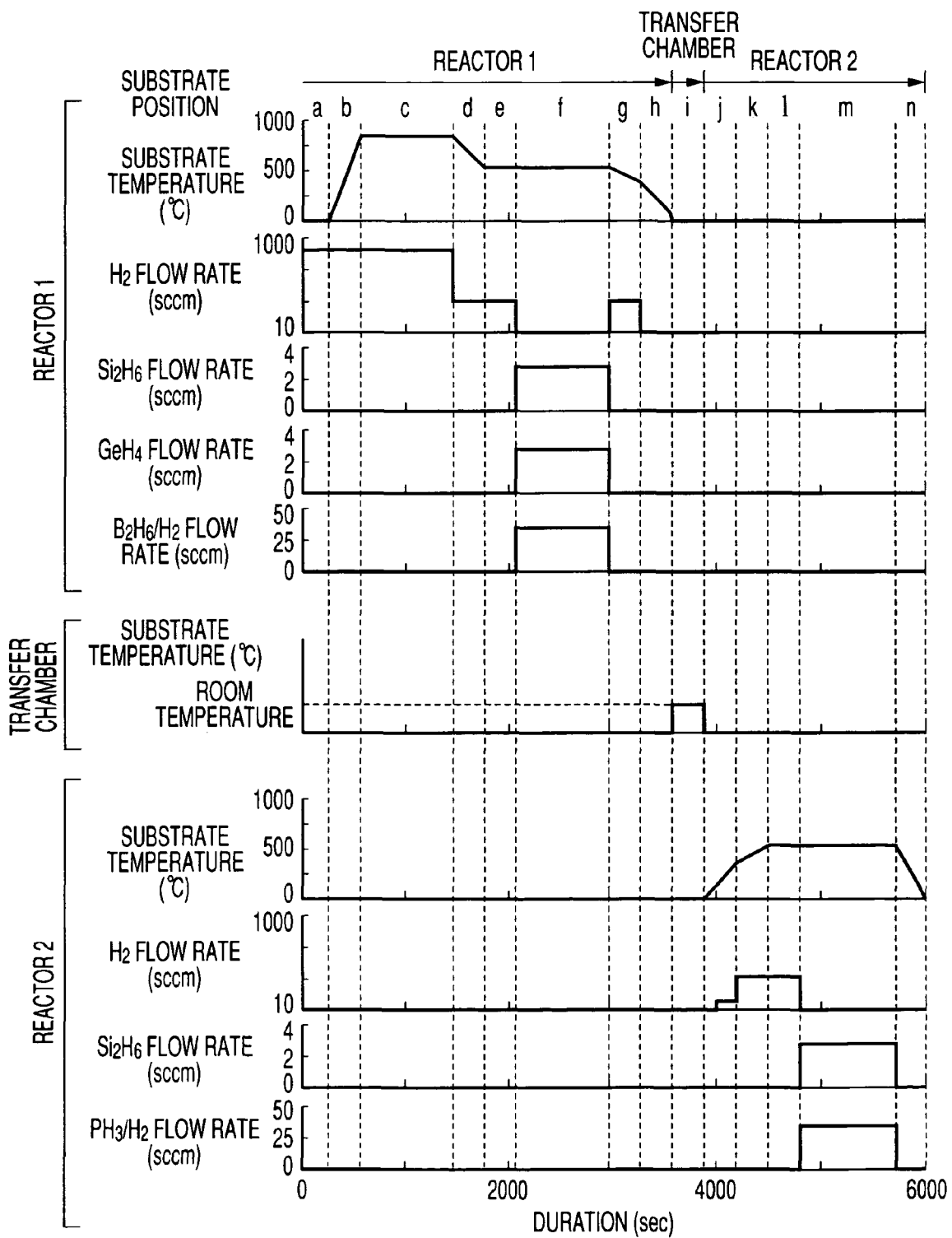
FIG. 1 is the first embodiment of a manufacturing process of a semiconductor device of the present invention and a drawing illustrating a growth sequence.

FIG. 1 is a drawing illustrating a sequence of the first embodiment of the present invention. This shows a sequence to form a multilayer film consisting of a highly-doped p-type single-crystal SiGe layer and a highly-doped n-type single-crystal Si layer on a single-crystal Si substrate. Processes from step g to step l correspond to the second process in the present invention. In step g, the first crystal growth (the first process in the present invention) is completed and the second process starts. Then, hydrogen is supplied until the substrate temperature drops to a predetermined temperature, for instance, in the vicinity of 200° C. (step g). When the substrate temperature drops to the predetermined temperature or lower, the supply of hydrogen is stopped (step h and step i). In step j, the substrate temperature is increased for the purpose of the second crystal growth in the second reactor. In this step j, when the substrate temperature increases to the predetermined temperature or more, hydrogen is supplied again. In steps k and l, since it becomes a high temperature condition before crystal growth, it goes without saying that hydrogen is supplied. Hereinafter, this embodiment will be explained in detail according to each step.

Figure 2:
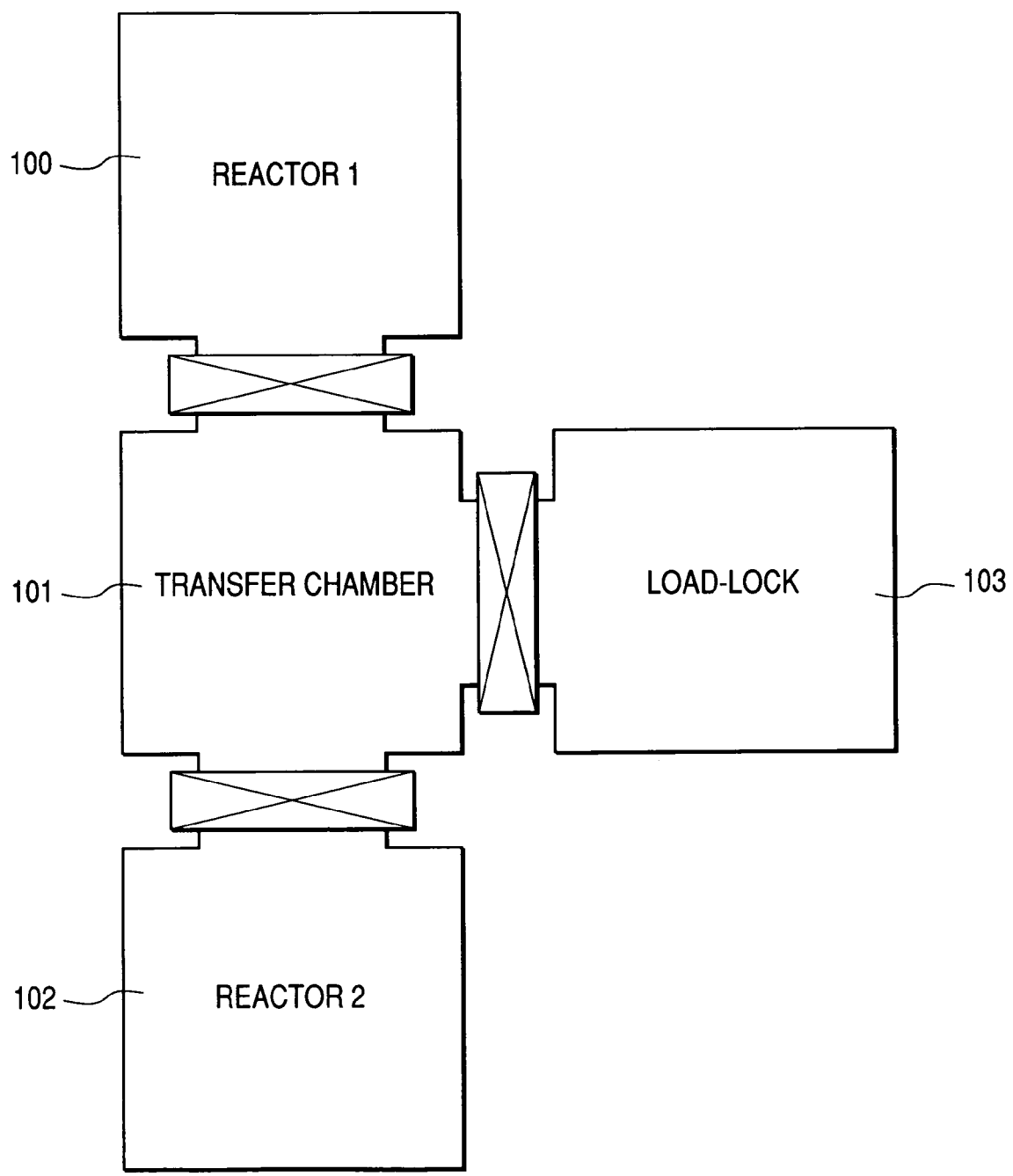
FIG. 2 is a block diagram illustrating a semiconductor manufacturing apparatus which is necessary to execute the growth shown in FIG. 1.

FIG. 2 is an epitaxial growth apparatus illustrating an example used for executing the present invention. This apparatus consists of a first reactor 100, a second reactor 102, a transfer chamber 101, and a load-lock chamber 103. In order to control precisely the doping concentration and the profile in the multilayer film composed of different conductive type semiconductor layers, it is necessary to avoid canceling the doping effect by taking the residual dopant in the reactor into the film. Therefore, it is preferable that doping be carried out independently in a reactor for p-type only and a reactor for n-type only rather than carrying out both p-type and n-type doping in a single reactor. In this embodiment, growth of a highly-doped p-type single-crystal SiGe layer is carried out in the first reactor 100 and growth of a highly-doped n-type single-crystal Si layer is carried out in the second reactor 102. In the combination of a reactor and a conductive type, the opposite case from this embodiment is also possible. Since the internal construction of the first reactor, the second reactor, and the transfer chamber, etc. may be the same as a regular one, a detailed explanation is omitted.

First of all, in the first reactor 100, a p-type single-crystal SiGe layer is grown on a Si substrate. The substrate is heated up in a hydrogen atmosphere prior to epitaxial growth in order to clean the surface of the Si substrate. $H_2$ is introduced before and after the epitaxial growth. $Si_2H_6$ and $GeH_4$ are used as the source gases for epitaxial growth, and $B_2H_6$ diluted by hydrogen which is supplied to the first reactor 100 is a p-type doping gas.

When growth in the first reactor 100 has been completed, the substrate is transferred from the first reactor 100 to the second reactor through the transfer chamber in order to grow a highly-doped n-type single-crystal Si layer in the second reactor. After this, an n-type single-crystal Si layer is grown epitaxially on the p-type single-crystal SiGe layer in the second reactor. Herein, the same as the case of the first reactor, $H_2$ is introduced before epitaxial growth. $Si_2H_6$ is a source gas for epitaxial growth, and $PH_3$ introduced in the second reactor with dilution by hydrogen is used for the n-type doping gas.

Figure 3:
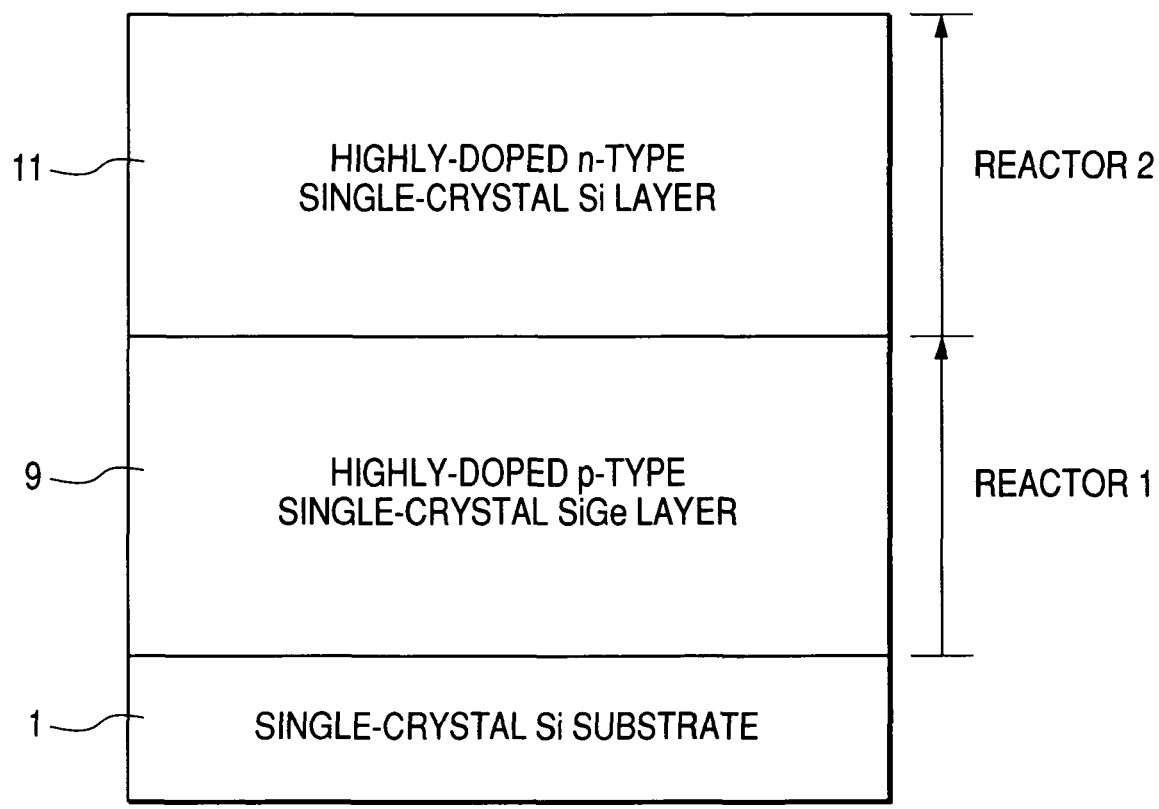
FIG. 3 is a drawing illustrating a cross-section of a semiconductor device fabricated using the growth sequence shown in FIG. 1.

FIG. 3 is a cross-sectional drawing illustrating a multilayer film forming a highly-doped p-type single-crystal SiGe layer 9 and a highly-doped n-type single-crystal Si layer 11 on a single-crystal substrate 1, which is formed by using the growth sequence shown in FIG. 1 and the epitaxial growth apparatus shown in FIG. 2. Hereinafter, each process to obtain this configuration will be explained concretely using FIGS. 1 to 3.

First of all, in order to remove contaminants and particles, a Si substrate is cleaned using a mixed solution of a solution composed of sulfuric acid and hydrogen peroxide solution, ammonium hydroxide, hydrogen peroxide solution, and water. Right before mounting the substrate in an epitaxial growth apparatus, the substrate is cleaned using an aqueous solution of hydrofluoric acid to remove the oxide layer formed on the surface, and then a hydrogen termination treatment of the Si atoms existing at the surface of the substrate is carried out by dipping in deionized water. There is an advantage in this treatment that reformation of the native oxide film on the surface of the Si substrate is suppressed to a maximum extent. Then, the single-crystal Si substrate 1 is mounted in the load-lock chamber 103 of the semiconductor manufacturing apparatus and evacuation is initiated. In order to prevent the introduction of moisture, oxygen, and carbon, into the transfer chamber 101 the substrate is mounted in the first reactor 100 through the transfer chamber 101 after evacuating the load-lock chamber 103 to about $1\times10^{-5}$ Pa or less. It is preferable that the pressure of the transfer chamber 101, the first reactor 100, and the second reactor 102 described later be in a vacuum condition of about $1\times10^{-5}$ Pa or less to avoid contamination of the surface of the substrate. In the first reactor 100, the second reactor 102, and the transfer chamber 101, it is needless to say that this pressure will be maintained if gas is not expressly supplied in the following steps. Next, the substrate is cleaned in order to remove the native oxide film formed after cleaning the substrate and contaminants. In this embodiment, a method in which high temperature heating is applied in a $H_2$ atmosphere is explained, but, except for this method, it is possible to use the methods in which the substrate is heated by using a cleaning gas, and the substrate is heated up to about 1000° C. under a condition of ultra high vacuum. 5000 sccm of clean $H_2$ gas is supplied to the first reactor 100 for cleaning (step a in FIG. 1). Each step a, b, c is shown at the top of FIG. 1 by attaching codes. Here it is preferable that the moisture concentration in the $H_2$ gas be about 50 ppb or less in order to obtain a thorough cleaning effect. It is preferable that the moisture concentration in the $H_2$ gas supplied to the first reactor 100 and to the second reactor 102 in the following processes be also controlled to be this value or less. Moreover, the flow rate of the $H_2$ gas is controlled to be 5000 sccm in this embodiment, but this flow rate is one example and it is acceptable if the flow rate is sufficient to obtain a predetermined pressure during cleaning. Moreover, the pressure during cleaning is preferably 10 Pa or more so as to supply the gas uniformly to the surface of the substrate and atmospheric pressure or less in order to maintain the safety of the apparatus. After supplying $H_2$ gas, heating of the Si substrate begins continuously (step b). There are heating techniques which typically use a resistance heater or a lamp heater. When the substrate is heated up to a cleaning temperature, the temperature is maintained for a predetermined time (step c). It is preferable that the substrate temperature during cleaning be 600° C. or more as a temperature to remove the native oxide film and contaminants effectively and 1000° C. or less as a temperature to maintain an excellent condition of the surface of the Si substrate. Moreover, the cleaning time may be decided from the relationship with the cleaning temperature. For instance, in the case of 600° C., it takes about 30 minutes. However, since native oxide films and contaminants can be removed more easily at high temperatures, it takes only about one minute in the case of 1000° C. In this embodiment, a combination of 850° C. for 5 minutes is selected in order to make preventing thermal diffusion of dopant in the substrate compatible with minimizing the cleaning time. After completing the above-mentioned cleaning, the substrate temperature is decreased to the epitaxial growth temperature (step d) and maintained at that temperature (step e). In these steps, in order to avoid adhesion of contaminants on the Si substrate after cleaning, it is preferable that the supply of clean hydrogen gas to the surface be maintained. It is preferable that the $H_2$ gas flow rate be 1 sccm or more to obtain the minimum effect for contamination control, and it is preferably almost equal to the total amount of gas flow rate supplied during the next epitaxial growth in order to prevent the substrate temperature from changing drastically according to the difference of gas flow rates when the subsequent epitaxial growth begins.

After this, the supply of $H_2$ gas stops and, at the same time, the source gas and the p-type doping gas are supplied in order to start the epitaxial growth of the highly-doped p-type single-crystal SiGe layer 9 (step f).

An ultra high vacuum CVD (UHV/CVD) technique, in which the source gas is introduced while exhausting to the ultra high vacuum with a turbo-molecular pump to grow a layer in a region of low pressure molecular flow, and a low pressure CVD (LPCVD) technique, in which a film grows while introducing a large amount of hydrogen gas as a carrier gas, are used as epitaxial growth techniques. Hereinafter, the growth conditions using these growth techniques will be described.

One having high reactivity is used for a source gas when epitaxial growth is carried out by using a UHV/CVD technique, because it is carried out in a region of low pressure molecular flow and the growth temperature is relatively low. In the case of the growth of a SiGe layer, for instance, $Si_2H_6$ is used as a source gas for Si and $GeH_4$ as a source gas for Ge. Since Si and Ge are completely miscible, the Ge content in the SiGe layer can be changed arbitrarily by controlling these gas flow rates. Moreover, if the growth pressure is controlled to be 10 Pa or less by controlling the gas flow rate, it becomes possible to grow the epitaxial layer uniformly. Herein, the growth pressure is one showing a general value, and the preferable pressure for uniform growth depends on the shape of the reactor and the pumping speed of the vacuum pump. The growth temperature may be controlled to be 400° C. or more to prevent deterioration of the crystallinity of the epitaxial layer and a decrease in the throughput by increasing the growth time and, additionally, the growth temperature may be controlled to be 650° C. or less to obtain an excellent surface morphology. As a result, a SiGe film with a Ge content of 15% can be formed by, for instance, supplying 3 sccm of $Si_2H_6$ and 3 sccm of $GeH_4$ and controlling the growth temperature to be 550° C. In the next step g, although $H_2$ gas is supplied again, it does not affect the quality of the epitaxial layer. Therefore, it is not always necessary to start the supply of hydrogen gas at the time when the epitaxial growth is complete as in this embodiment, and it is possible to start it at the time of initiating growth and during growth. In the case when $H_2$ gas is supplied during growth, the total of the partial pressures of the source gas and the doping gas may be controlled to be almost the same as that when $H_2$ gas is not supplied.

On the other hand, when growth is carried out by an LPCVD technique, a gas having lower reactivity than the gas used in a UHV/CVD technique is supplied as a source gas. This is because, if the reactivity of the source gas is high, a reaction in the vapor phase is generated which causes deterioration of the crystallinity of the deposited film. Therefore, as a source gas for Si, Si hydride gas and chloride gas such as monosilane ($SiH_4$) and dichlorosilane ($SiH_2Cl_2$) are preferably used. As a source gas for Ge, except for $GeH_4$, Ge hydride gas and chloride gas can be used, the same as the case of Si. The Ge content in the SiGe layer can be changed by controlling these gas flow rates, the same as the case of a UHV/CVD technique. Moreover, the flow rates of the source gas and hydrogen which is the carrier gas are controlled, and for instance, the growth pressure is kept from about 1000 Pa to about 10000 Pa. In order to achieve decomposition of the gas and excellent crystallinity at the same time, the growth temperature may be controlled from 600° C. to about 800° C.

Moreover, whether it is either the UHV/CVD technique or the LPCVD technique, it is possible to perform p-type doping by supplying the doping gas with the source gas simultaneously. A doping gas including group III elements such as B, for instance, $B_2H_6$ etc. may be used for the addition of p-type impurities. In the above description, a variety of concrete examples were shown as the epitaxial growth conditions. However, even in the case of conditions other than these, if it is in a range where epitaxial growth is possible, it can be applied to this process.

As mentioned before, hereinafter, the steps from g to l correspond to the second process of the present invention.

After growing the highly-doped p-type single-crystal SiGe layer 9, the supply of the source gas and the doping gas is stopped and introduction of $H_2$ gas begins simultaneously, and the substrate temperature is decreased (step g).

Next, the supply of $H_2$ gas stops when the substrate temperature becomes lower than the predetermined temperature and the substrate temperature is decreased continuously (step h). In order to avoid desorption of hydrogen terminating the surface of the epitaxial layer and adsorption of moisture, oxygen, and carbon to the surface, the substrate temperature, when introduction of $H_2$ gas stops, is preferably lower than the temperature for hydrogen desorption from the surface.

Therefore, if, for example, it is the surface of the Si layer, it is preferable that the introduction of the gas be stopped at a temperature of 400° C. or less. In the case of the SiGe layer, since hydrogen desorption occurs easily from Ge atoms rather than from Si atoms, the introduction of gas preferably stops at a substrate temperature of about 300° C. Moreover, even over a range of substrate temperatures in which hydrogen is not eliminated from the surface and the hydrogen termination surface is still maintained, the surface structure changes according to the temperature if $H_2$ gas continues to be supplied to the surface. For instance, in the case of the surface of the hydrogen-terminated Si (100), a monohydride in which one hydrogen atom bonds to one Si atom at the surface is formed until the substrate temperature decreases to about 150° C. However, when it becomes about 150° C. or less, not only a monohydride but also a dihydride is formed in which two hydrogen atoms bond to one Si atom at the surface. Then, when the substrate temperature decreases to about 40° C. or less, the formation of monohydride almost cannot be observed and a dihydride is formed at almost all areas of the surface. If the Ge content is 30% or less, the main component of the surface is Si, so that these changes are almost the same even if it is a SiGe layer as in this embodiment. On the other hand, even if it is the surface of the hydrogen-terminated Si (100) and if $H_2$ gas is not supplied to the surface, a dihydride is not formed, even in the case of the substrate temperature being about 150° C. or less, and the structure of monohydride is maintained. Adsorption of oxygen atoms to the surface of the hydrogen-terminated Si (100) occurs easily when a dihydride is formed as compared with a monohydride. Accordingly, if hydrogen gas is supplied under a condition where the substrate temperature is about 150° C. or less, the surface of the epitaxial layer is oxidized easily by moisture and oxygen. Therefore, it is preferable that the substrate temperature, when introduction of $H_2$ gas is stopped in step h, be about 400° C. or less and about 150° C. or more. Here, a concrete value was offered to explain the substrate temperature for stopping $H_2$ gas introduction. However, it goes without saying that these values depend on, for instance, the $H_2$ gas partial pressure in the first reactor 100. Moreover, if it is a substrate with hydrogen termination at the surface, contaminants, except for oxygen, such as carbon are hardly adsorbed, so that contamination can be reduced by changing the introduction of $H_2$ gas depending on the substrate temperature as mentioned above.

When the substrate temperature is decreased, the substrate is transferred from the first reactor to the second reactor through the transfer chamber (step i). Although the substrate temperature during transfer is room temperature in this embodiment, this temperature is only one example, and it is preferable that the substrate temperature be about 150° C. or less in which monohydride is formed at the substrate surface.

After completing the transfer, the substrate is heated up to grow the second semiconductor layer in the second reactor (step j). Herein, the supply of $H_2$ gas starts on during heating up, and the substrate temperature is increased to a temperature for performing epitaxial growth continuously (step k). The substrate temperature when the supply of $H_2$ gas starts can be thought to be the same as in the aforementioned steps g and h. When the substrate temperature is made stable while supplying $H_2$ gas continuously (step l), the supply of $H_2$ gas stops and the source gas and the n-type doping gas are introduced to start epitaxial growth of the highly-doped n-type single-crystal Si layer 11 (step m). The aforementioned UHV/CVD technique and LPCVD technique can also be used for the manufacturing method in this step. Moreover, if the doping gas is supplied simultaneously with the source gas, n-type doping is possible using either the UHV/CVD technique or the LPCVD technique. A doping gas including a group V element such as P and As, etc., for instance $PH_3$ and arsine ($AsH_3$), etc. may be used for adding n-type impurities. The highly-doped n-type single-crystal Si layer 11 is grown by selecting a preferable growth technique from the above-mentioned ones. The substrate temperature is decreased at the same time that the supply of the source gas and the doping gas are stopped (step n), and the substrate is finally returned from the second reactor 102 to the load-lock chamber 103, resulting in the multilayer film structure shown in FIG. 3 being obtained.

According to this embodiment, since the supply of $H_2$ gas is changed depending on the substrate temperature, the surface of the substrate is not contaminated by oxygen and carbon when the substrate temperature is low. Therefore, since a highly-doped n-type single-crystal Si layer 11 with excellent crystallinity is grown on the highly-doped p-type single-crystal SiGe layer 9, the formation of a high quality multilayer film becomes possible. Moreover, since cleaning at high temperatures in not necessary before growth of the highly-doped n-type single-crystal Si layer 11, degradation of the crystallinity of the highly-doped p-type single-crystal SiGe layer 9 is suppressed and redistribution of dopant by thermal diffusion can also be prevented. Therefore, in a semiconductor device formed by using this multilayer film it is possible to achieve high performance through high speed operation and a reduction in resistance.

Second Embodiment

Figure 4:
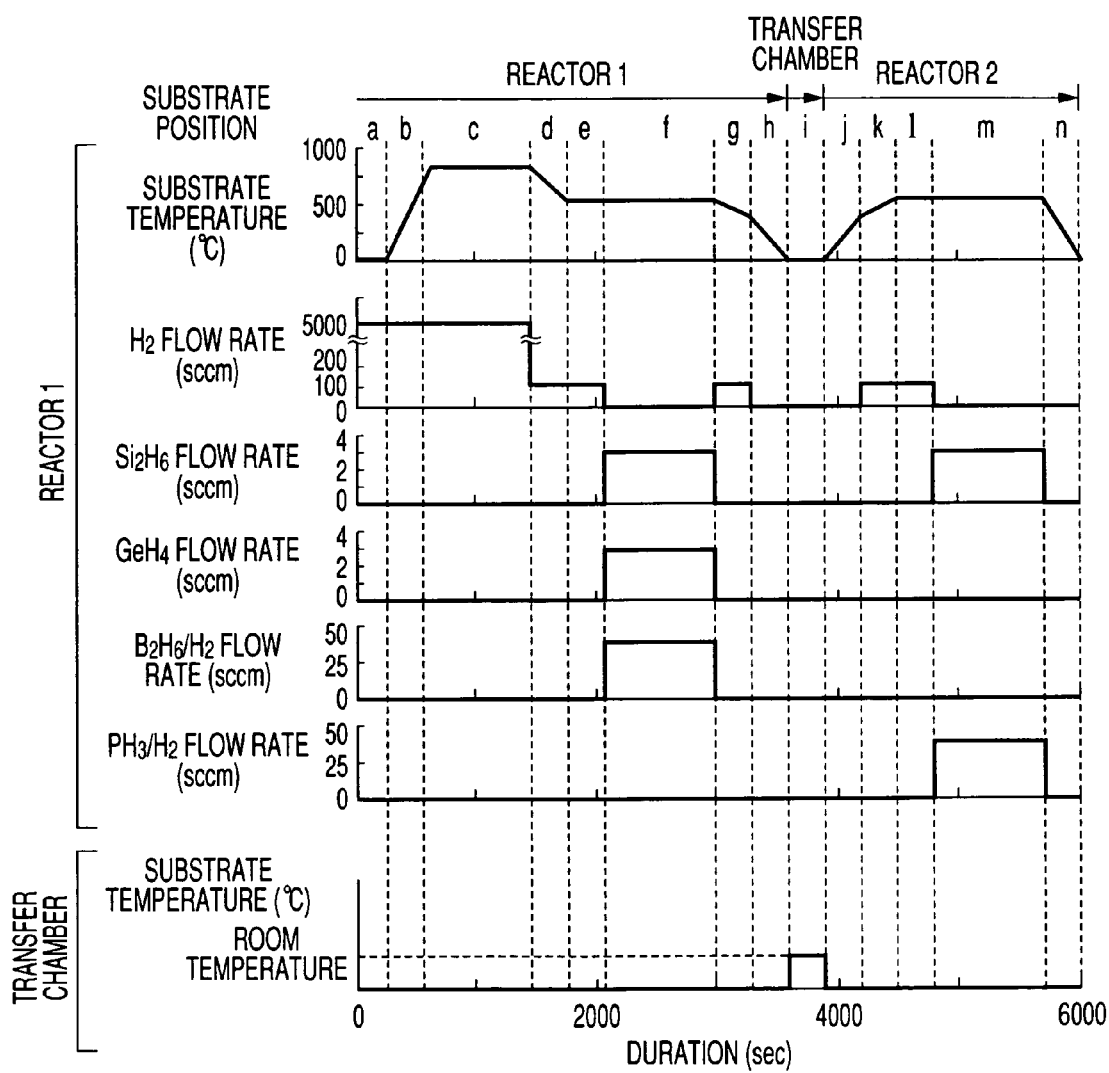
FIG. 4 is the second embodiment of a manufacturing process of a semiconductor device of the present invention and a drawing illustrating a growth sequence.

FIG. 4 is a drawing illustrating a sequence of the second embodiment of the present invention. FIG. 4 shows a sequence to form a multilayer film consisting of a highly-doped p-type single-crystal SiGe layer 9 and a highly-doped n-type single-crystal Si layer 11 on a single-crystal Si substrate 1. The following points are the differences between the first embodiment and this embodiment. In the first embodiment, a highly-doped n-type single-crystal Si layer was grown in the second reactor on the highly-doped p-type single-crystal SiGe layer 9 grown in the first reactor 100. However, in this embodiment, a highly-doped n-type single-crystal Si layer is also grown in the first reactor 100 in which the highly-doped p-type single-crystal SiGe layer 9 was grown.

Processes from step g to step l correspond to the second process in the present invention. In step g, the first crystal growth (the first process in the present invention) is completed and the second process starts. Then, hydrogen is supplied until the substrate temperature drops to a predetermined temperature (step g). When the substrate temperature drops to the predetermined temperature or lower, the supply of hydrogen is stopped (step h and step i). In step j, the substrate temperature is increased for the purpose of second crystal growth in the second reactor. In this step j, when the substrate temperature increases to the predetermined temperature or higher, hydrogen is supplied again. In steps k and l, since it becomes a high temperature condition before crystal growth, it goes without saying that hydrogen is supplied. Hereinafter, this embodiment will be explained in detail according to each step.

Formation of the multilayer film starts from the growth of a highly-doped p-type single-crystal SiGe layer 9 on the Si substrate 1 in the first reactor 100. The substrate temperature, the $H_2$ gas flow rate, the flow rates of $Si_2H_6$ and $GeH_4$ which are the source gases for epitaxial growth, and the flow rate of hydrogen-diluted $B_2H_6$ which is the p-type doping gas are the same as those in the first embodiment.

Next, after growth of the highly-doped p-type single crystal SiGe layer 9, the substrate is transferred from the first reactor 100 to the transfer chamber 101 in order to clean the first reactor. The substrate temperature in the transfer chamber 101 is, for instance, room temperature. Then, after this, a substrate which was prepared separately from substrate 1 on which the multilayer film is formed is transferred to the first reactor 100. It is acceptable to use a single-crystal Si substrate as a substrate material, but a Si substrate where a Si oxide film is formed on the surface and a SiC substrate are preferable for cleaning at high temperatures. After transferring another substrate, a cleaning gas is introduced to the first reactor 100. As a cleaning gas, $H_2$ gas, $Cl_2$ gas, HCl gas, and a mixed gas thereof can be used. Then, heating the substrate begins. In order to obtain a thorough cleaning effect, 1000° C. or more is preferable for a substrate temperature for cleaning. Then, the substrate is maintained at a high temperature condition for a certain period of time. The higher the substrate temperature, the shorter this time can be made. For instance, when the substrate temperature is 1200° C., it is about 5 minutes. After this, cleaning is completed by decreasing the substrate temperature while exhausting gas in the first reactor 100. When cleaning of the first reactor 100 has been completed, the substrate is returned from the transfer chamber 101 to the first reactor 100. After this, an n-type single-crystal Si layer 11 is grown in the first reactor 100. The substrate temperature, the $H_2$ gas flow rate, the $Si_2H_6$ flow rate which is the source gas, and the $PH_3$ flow rate which is the doping gas can be treated the same as in the first embodiment.

Figure 5:
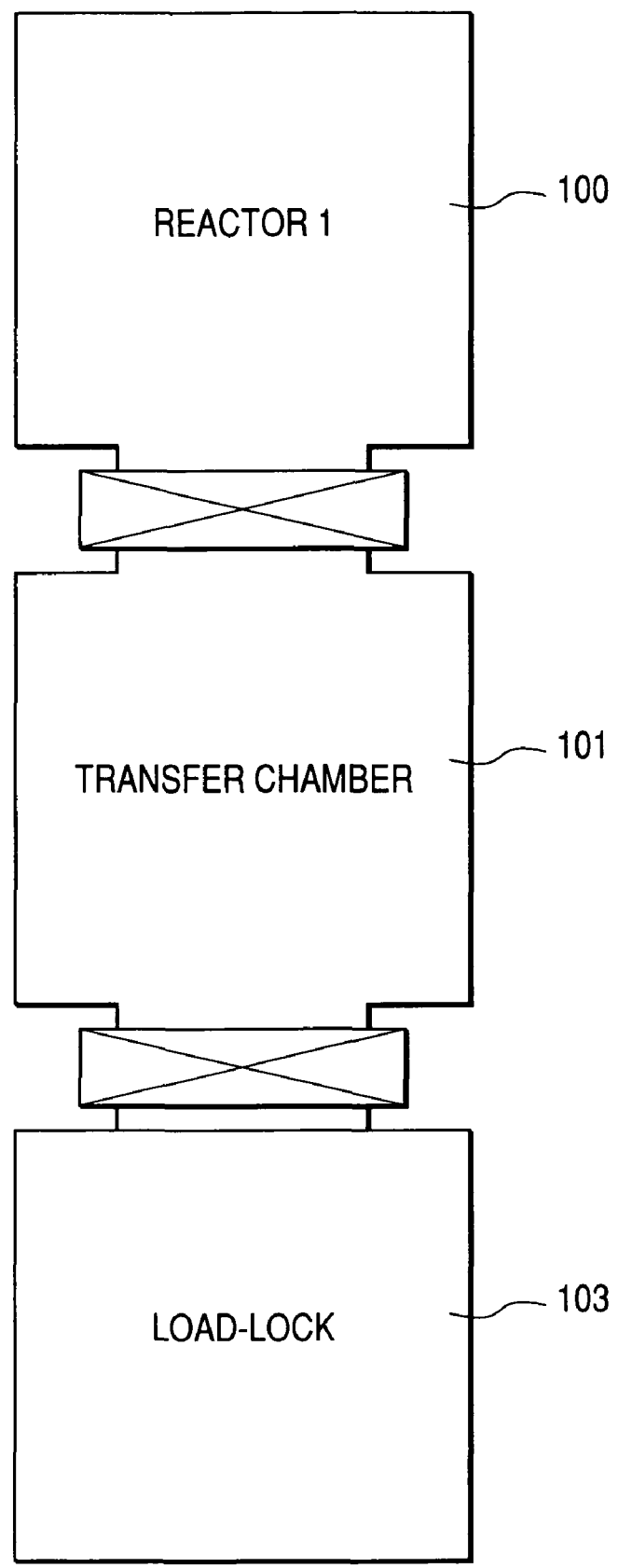
FIG. 5 is a block diagram illustrating a semiconductor manufacturing apparatus which is necessary to execute the growth shown in FIG. 4.

FIG. 5 is an epitaxial growth apparatus illustrating an example used to realize the semiconductor layer shown in FIG. 4. This apparatus consists of a first reactor 100, a transfer chamber 101, and a load-lock chamber 103, which are different from those in the first embodiment. As mentioned above, in order to control accurately the doping concentration and the profile in the multilayer composed of different conductive type semiconductor layers, it is necessary to avoid canceling the doping effect by remaining impurities which have different conductivity. Therefore, in this embodiment, p-type doping is carried out, and then an n-type doped semiconductor layer is formed after the influence of the memory effect is decreased by cleaning the first reactor 100.

According to this embodiment, both p-type and n-type doping can be performed in a single reactor. Therefore, the capital cost of the apparatus and the maintenance cost thereof can be reduced compared with the first embodiment. Therefore, there is an advantage that the manufacturing cost of a semiconductor device made by using this embodiment is drastically reduced.

Third Embodiment

Figure 6:
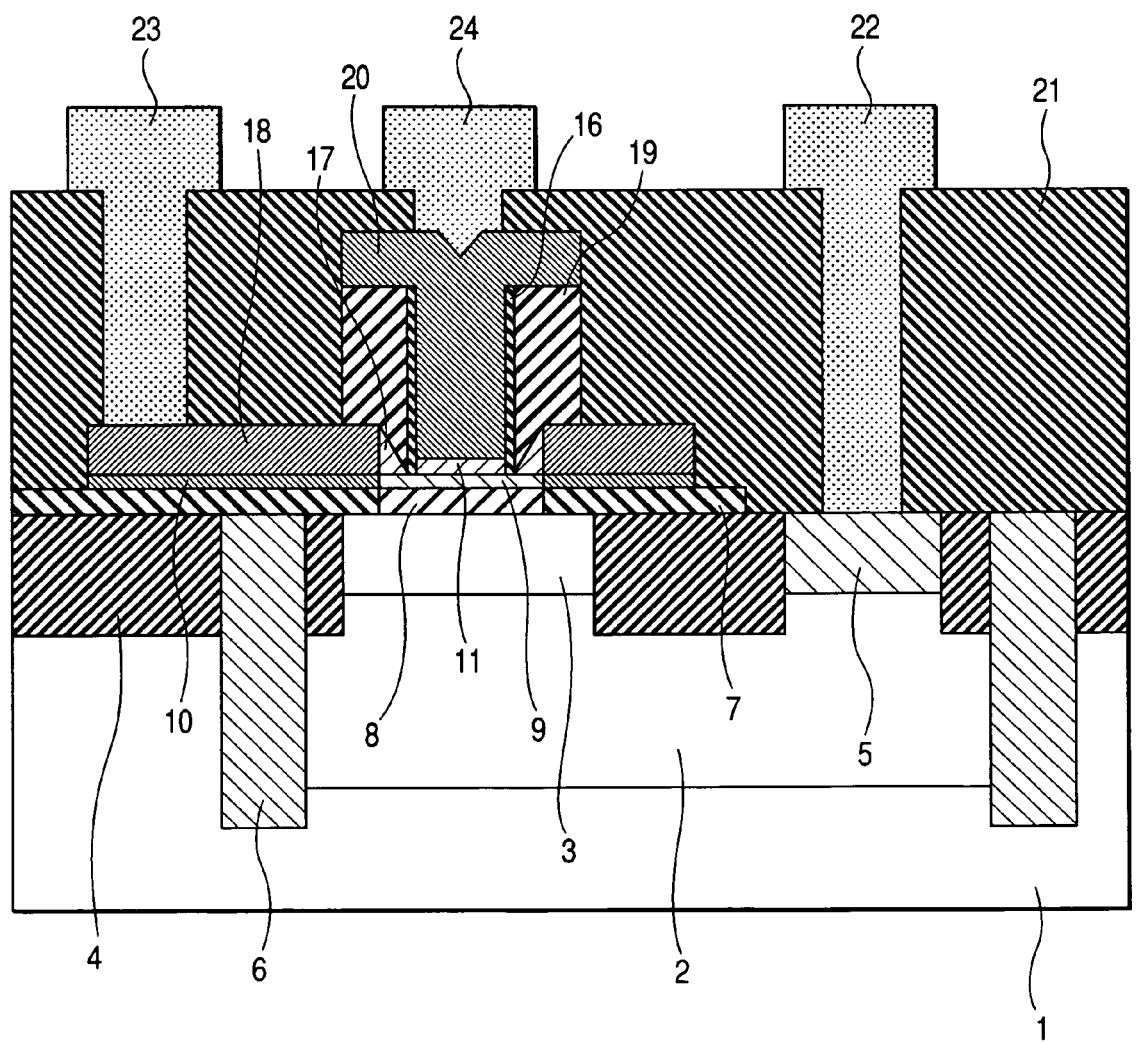
FIG. 6 is the third embodiment of a manufacturing process of a semiconductor device of the present invention and a longitudinal section of a SiGe HBT.

FIG. 6 shows the third embodiment of the present invention. FIG. 6 is a longitudinal section structure of a SiGe HBT. A semiconductor substrate comprising a highly-doped n-type single-crystal Si layer 2 to be a so-called buried layer, an n-type single crystal Si layer 3 to be part of a collector, a first collector/base isolation insulator film 4, a highly-doped n-type single-crystal Si layer 5 to be a collector lead layer, and an isolation insulator film 6, is formed on a Si substrate 1. Then, a second collector/base isolation insulator film 7 is formed on the surface of the substrate except for the parts on which an intrinsic region of the HBT and a collector lead layer are formed. On the n-type single-crystal Si layer 3 exposing the surface, an n-type single-crystal SiGe layer 8 to be a collector, a highly-doped p-type single-crystal SiGe layer 9 to be a base, and a highly-doped n-type single-crystal Si layer 11 to be an emitter are grown in order epitaxially. Moreover, a highly-doped p-type poly-crystal SiGe layer 10 is formed on the insulator film 7 simultaneously with the highly-doped p-type single-crystal SiGe layer 9. Furthermore, an emitter/base isolation insulator film 16 is formed on the sidewall of the emitter. A single-crystal region 17 connected to an edge of the highly-doped p-type single-crystal SiGe layer 9 and a highly-doped p-type Si layer comprising a poly-crystal region 18 which is grown on the highly-doped poly-crystal SiGe layer 10 are used for a base lead electrode. A highly-doped n-type poly-crystal Si layer 20 is formed as an emitter lead electrode, and an insulator layer 21 having openings is deposited on the entire surface of the substrate. Moreover, a connector electrode 22, a base electrode 23, and an emitter electrode 24 composed of a metallic film are formed in the openings of the insulator film 21.

Next, FIGS. 7A to 7E show the flow for fabricating a HBT having the structure shown in FIG. 6. These cross-sections are typical ones in a manufacturing method of this HBT, and are longitudinal sections in the vicinity of the intrinsic region of the HBT.

After a highly-doped n-type single-crystal Si layer 2 is formed by ion implantation as a so-called buried layer on the Si substrate, an n-type single-crystal Si layer 3 to be a part of collector is grown epitaxially thereon by, for instance, a chemical vapor deposition (CVD) technique. Herein, for instance, P, As, and Sn are preferable as n-type impurities, and the impurity concentration is preferably controlled to be about $1 \times 10^{18}$ cm$^{-3}$ or less to decrease the base/collector breakdown voltage and to suppress an increase in the capacitance between the base and collector.

Using, for instance, a CVD technique a first collector/base insulator film 4 is deposited on the substrate, except for the region to form the intrinsic region of the HBT and the collector lead layer. Then, after forming a highly-doped n-type single-crystal Si layer 5 to be a collector lead layer, an isolation region 6 is formed.

Then, a second collector/base isolation insulator film 7 is deposited on the surface of the substrate. The film thickness is controlled to be the same as the film thickness of a collector layer which is selectively grown later, for instance, preferably about 50 nm. After this, by using patterning and etching, an opening is formed by removing the second collector/base isolation insulator film 7 existing at the part, in which an intrinsic region of the HBT is formed to be smaller than the area of the opening of the n-type single-crystal Si layer 3. After this, the substrate is cleaned by using the same way as the first embodiment; the substrate is mounted in the semiconductor manufacturing apparatus; and the substrate is transferred to the second reactor 102 described in the first embodiment. The substrate is cleaned by using the same way as the first embodiment; the substrate is set-up to make it the growth temperature; and a n-type single-crystal SiGe layer 8 to be a collector is selectively grown only at the previously formed openings. The aforementioned UHV/CVD technique and LPCVD technique are preferable for this growth technique.

In order to grow an epitaxial layer selectively by using a UHV/CVD technique, there is a method in which a halogen-based gas such as HCl and $Cl_2$, etc. creating an etching reaction is supplied simultaneously with a source gas. For instance, selective growth of the SiGe layer is made possible up to about 200 nm by adding 10 sccm of $Cl_2$ to $Si_2H_6$ and $GeH_4$ with a gas flow rate of 3 sccm. There is another method which does not use an etching gas but takes advantage of the growth properties that depend on the substrate material and differ up until the time of the start of film deposition. The time until starting deposition is generally called an incubation time, and, when an epitaxial layer is formed on a single crystal, if the surface of the single crystal is kept clean, there is almost no incubation time. Therefore, growth starts almost at the same time as the supply of the source gas. However, for instance on an insulator film, growth starts after a certain incubation period passes since the gas supply is started. Therefore, for instance, in the case when an insulator film substrate which has openings exposing the Si surface, an epitaxial layer can be formed selectively only on the Si surface until the period when deposition starts on the insulator film. In order to improve the selectivity, one only has to control the growth condition to make the incubation time on the insulator film longer. For instance, one only has to reduce the flow rate of the source gas and increase the growth temperature. According to the method mentioned above, for instance, in the case when the $Si_2H_6$ flow rate is controlled to be 3 sccm, the $GeH_4$ flow rate also 3 sccm, and the growth temperature 550° C., the SiGe layer can be grown selectively up to about 100 nm if it is on an opening of a Si substrate with an insulator film.

On the other hand, in order to achieve selective growth by using a LPCVD technique, a method is preferable in which the etching gas is supplied with the source gas. For instance, when a SiGe layer is selectively grown, one only has to add HCl at 20 ml per minute in addition to a gas flow rate of $SiH_4$ of 10 ml per minute.

Moreover, in order to carry out n-type doping, one only has to supply $PH_3$, etc. with the source gas, the as same as in the first embodiment. The doping concentration is preferably $1 \times 10^{18}$ cm$^{-3}$ or less to maintain a sufficient base/collector breakdown voltage and to suppress an increase in the capacitance between the base and collector.

Moreover, in order to prevent the penetration of the dopant B diffusing from the base, C may be added to the whole or a part of the n-type single-crystal SiGe layer 8. This is due to the reduction in interstitial Si by adding C, although B in the single-crystal SiGe layer diffuses through the interstitial Si which is a point defect. C content is preferably 0.01% or more to obtain the suppression effect of B diffusion. However, since the solubility of C is low in the single-crystal Si layer and in the single-crystal SiGe layer, there is a problem that the crystallinity is easily deteriorated with increasing C content. Therefore, it is preferable to make the added C content about 5% or less.

After growing the n-type single-crystal SiGe layer 8, the substrate is transferred to the first reactor through the transfer chamber, the same as the first embodiment. This embodiment will be explained by using the formation of the semiconductor multilayer film shown in the first embodiment, but a method shown in the second embodiment may also be used. Therefore, after the first reactor 100 is cleaned, the substrate may be returned to the first reactor 100. Hereinafter, in the other embodiments, the formation process of a semiconductor multilayer film is similar. Then, specifically, a highly-doped p-type SiGe layer is grown on the entire surface of the substrate without cleaning the substrate. At this time, a highly-doped p-type single-crystal SiGe layer 9 to be a base is formed on the n-type single-crystal SiGe layer 8. On the other hand, a highly-doped p-type poly-crystal SiGe layer 10 is formed on the second collector/base isolation insulator film. Although the growth conditions and method are the same as those shown in the first embodiment, the preferable conditions can be changed in a range over which it can grow. Moreover, in order to achieve high performance of the HBT, it is necessary that the formation of the thin base layer be compatible with a high concentration of the base impurities. Therefore, it is preferable to control the film thickness of the highly-doped p-type single-crystal SiGe layer 9 to be 10 nm or less, and the base doping concentration to be $1 \times 10^{19}$ cm$^{-3}$ or more.

Furthermore, Ge has about a 4.2% larger lattice constant than Si, so that the SiGe layer grown on the Si substrate generally involves a lattice strain. The lattice strain increases with increasing the Ge content and the film thickness of the SiGe layer at the beginning of growth, but it is relieved as growth progresses. Dislocations and crystal defects are created inside the SiGe layer when the lattice strain is generated. This causes the operation performance of the HBT to be deteriorated. Therefore, it is desirable to assume a Ge content of the base to be about 50% or less. Moreover, when B is highly doped in the Si or SiGe layer, the crystallinity degrades due to clustering of B atoms, so that it is desirable to control a doping concentration of the base to be about $5 \times 10^{21}$ cm$^{-3}$ or less.

Additionally, the same as the n-type single-crystal SiGe layer, C may be added to the whole or a part of the highly-doped p-type single-crystal SiGe layer 9 for the purpose of preventing thermal diffusion of B. The C content which can be added is the same level as in the n-type single-crystal SiGe layer 8.

Figure 7A:
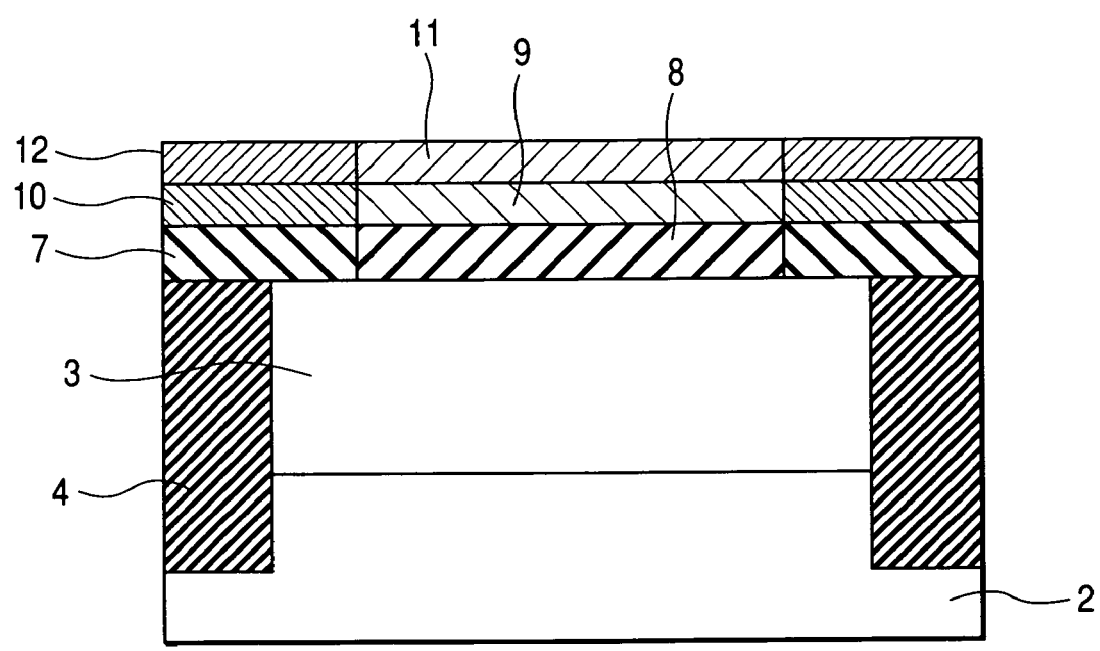
FIG. 7A is a partially expanded cross-section where a manufacturing process of an HBT of the present invention shown in FIG. 6 is shown in order.

The substrate is transferred again to the second rector 102 through the transfer chamber 101 after growth of the highly-doped p-type SiGe layer is completed. Then, a highly-doped n-type Si layer is grown on the entire surface of the substrate without particularly cleaning the substrate. At this time, a highly-doped n-type single-crystal Si layer 11 to be an emitter is formed on the p-type single-crystal SiGe layer 9. On the other hand, a highly-doped n-type poly-crystal Si layer 12 is formed on the p-type poly-crystal SiGe layer 10. Although the growth conditions and method are the same as those shown in the first embodiment, preferable conditions can be changed in a range over which it can grow. Moreover, it is necessary to decrease the emitter resistance to achieve high performance of the HBT. Therefore, it is preferable to control the emitter doping concentration to be $1 \times 10^{20}$ cm$^{-3}$ or more when the film thickness of the highly-doped n-type single-crystal Si layer 11 is controlled to be about 15 nm. Furthermore, since C has the effect of controlling the thermal diffusion of not only B but also of P, C may be added to the whole or a part of the highly-doped n-type single-crystal Si layer 11. The level of C content which can be added is similar to the n-type single-crystal SiGe layer 8 and the highly-doped p-type single-crystal SiGe layer 9. As a result, the structure of FIG. 7A is obtained.

Figure 7B:
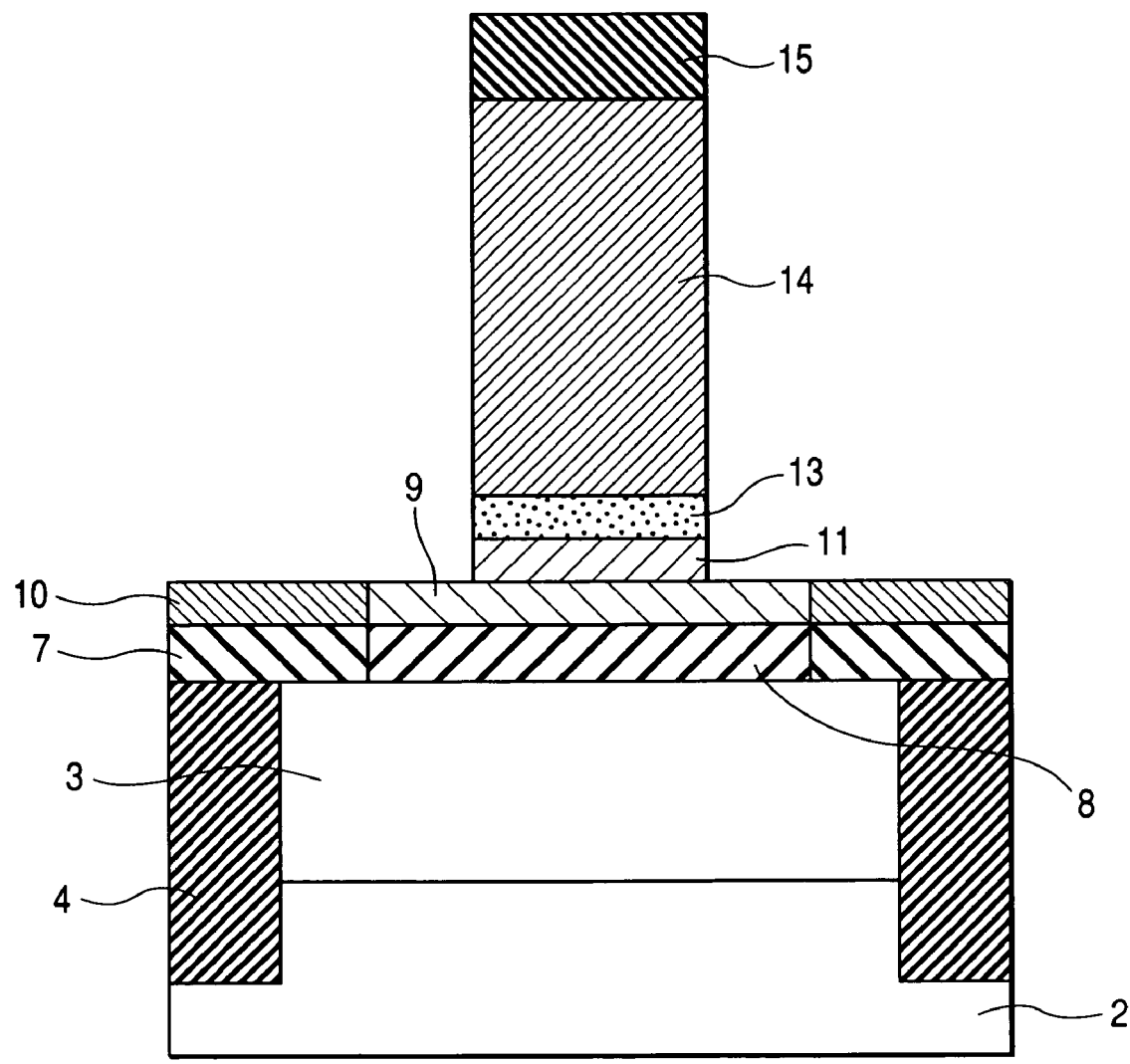
FIG. 7B is a partially expanded cross-section where a manufacturing process of an HBT of the present invention shown in FIG. 6 is shown in order.

Then, an insulator film 13, a semiconductor layer 14, and an insulator film 15 are deposited, in order, on the entire surface of the substrate. Each layer now deposited is removed by patterning and etching except for the emitter electrode formation region to fabricate the dummy emitter. Then, the highly-doped n-type single-crystal Si layer 11, except for the emitter electrode formation region, and the highly-doped n-type poly-crystal Si layer 12 are removed by etching. As a result, the structure of FIG. 7B is obtained.

Figure 7C:
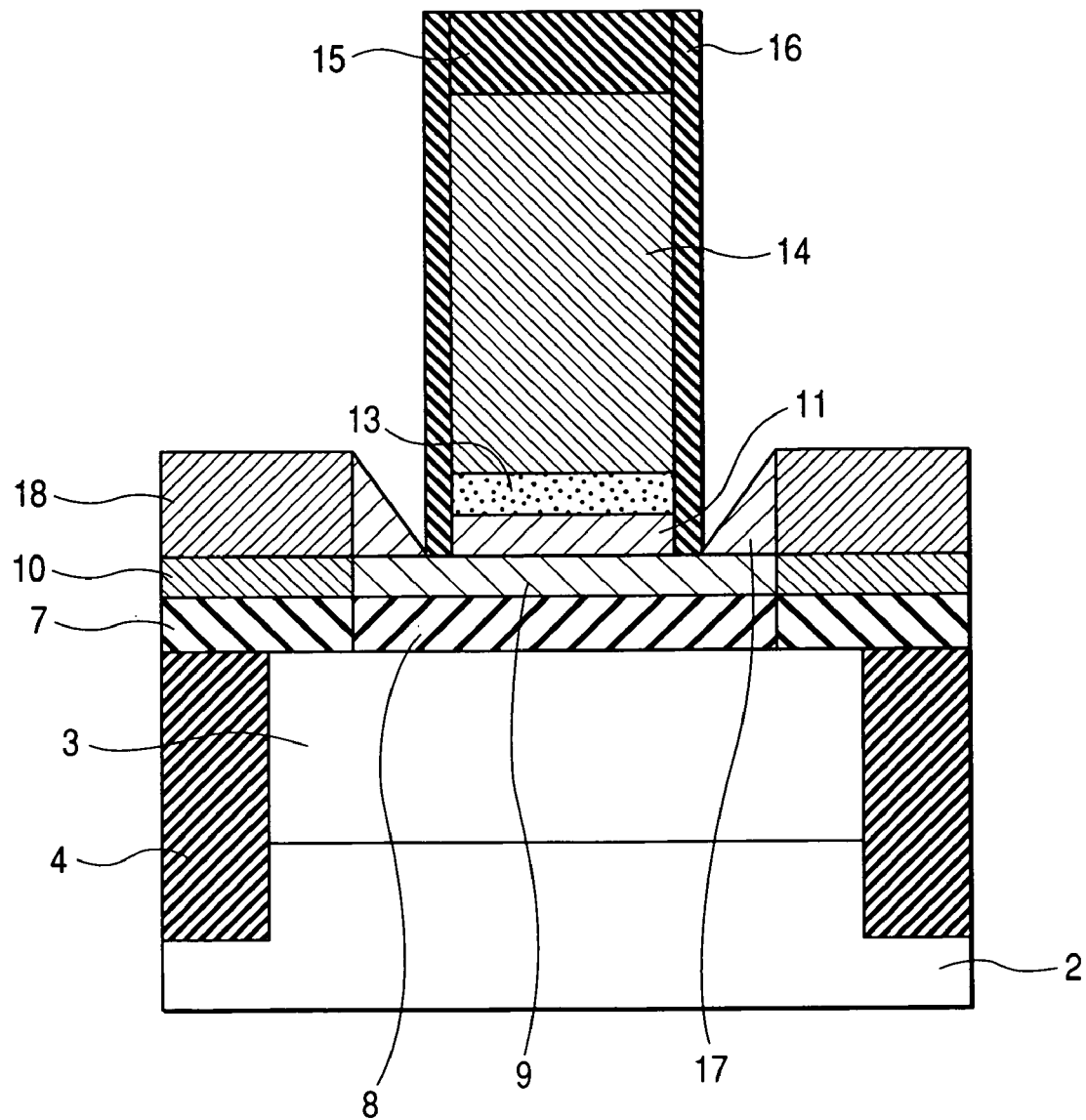
FIG. 7C is a partially expanded cross-section where a manufacturing process of an HBT of the present invention shown in FIG. 6 is shown in order.

Next, an insulator film 16 to be a part of the emitter/base isolation insulator film is deposited over the entire surface of the substrate, and then the insulator film 16 now deposited is removed except for the sidewall of the dummy emitter. After this, the substrate is cleaned by using the same way explained in the first embodiment; the substrate is mounted in the semiconductor manufacturing apparatus; and the substrate is transferred to the first reactor 100 described in the first embodiment. Then, a highly-doped p-type Si layer to be the base lead electrode is selectively grown without particularly cleaning the substrate. At this time, a highly-doped p-type single-crystal Si layer 17 is formed on the surface of the highly-doped p-type single-crystal SiGe layer 9. Moreover, a highly-doped p-type poly-crystal Si layer 18 is formed on the top of the highly-doped p-type poly-crystal SiGe layer 10. Since the growth method and conditions are the same as the ones which were explained in the first embodiment and used when forming the n-type single-crystal SiGe layer 8 of this embodiment, the explanation is omitted here. It is preferable that the film thickness be maintained at about 20 nm or more in order to minimize the effect, in which the resistivity becomes higher according to the grain boundaries in the poly-crystal layer. Moreover, it is desirable to control the doping concentration to be about $1 \times 10^{20}$ cm$^{-3}$ or more to avoid the base resistance from becoming higher. As a result, the structure of FIG. 7C is obtained.

Figure 7D:
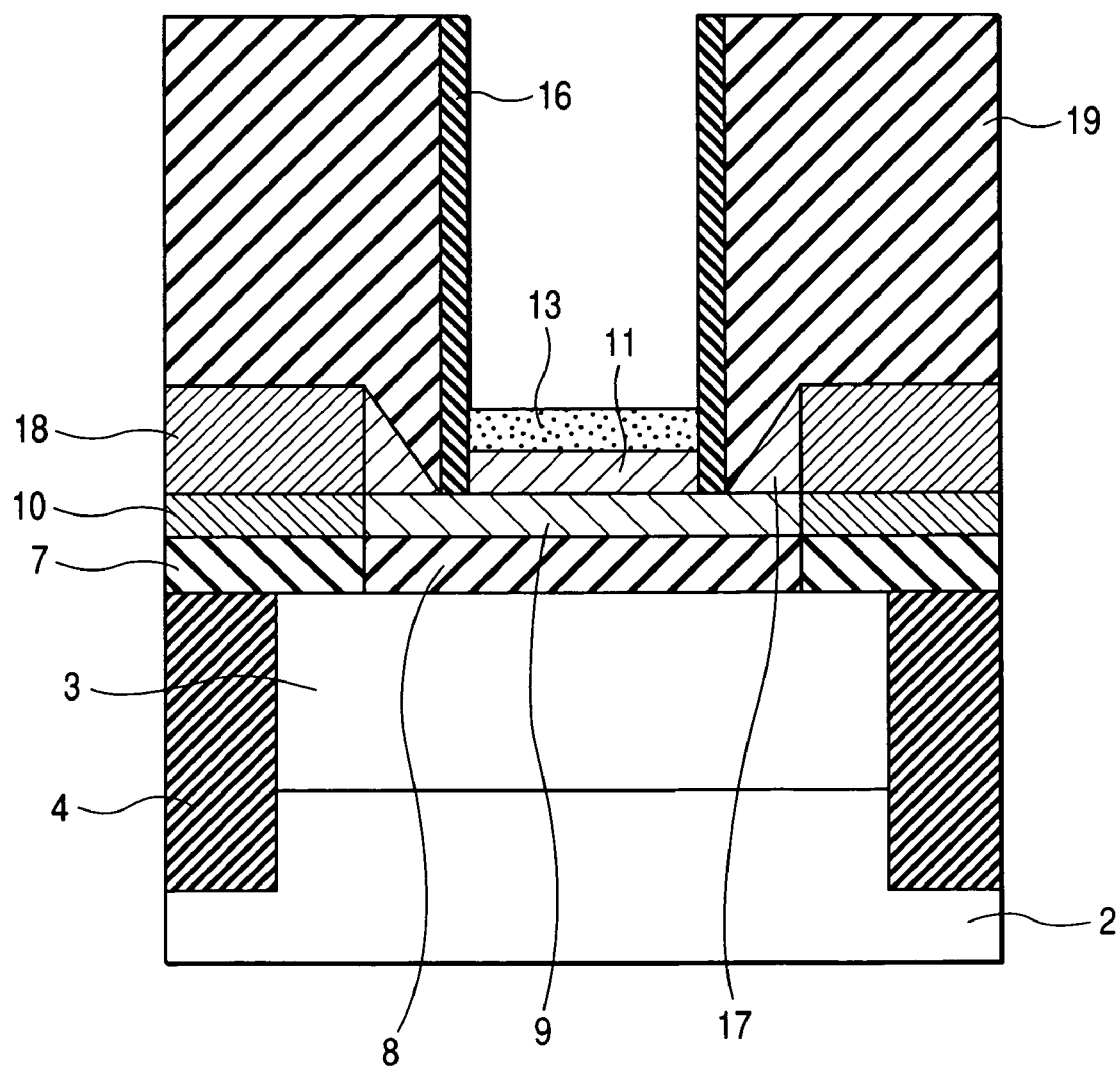
FIG. 7D is a partially expanded cross-section where a manufacturing process of an HBT of the present invention shown in FIG. 6 is shown in order.
Figure 7E:
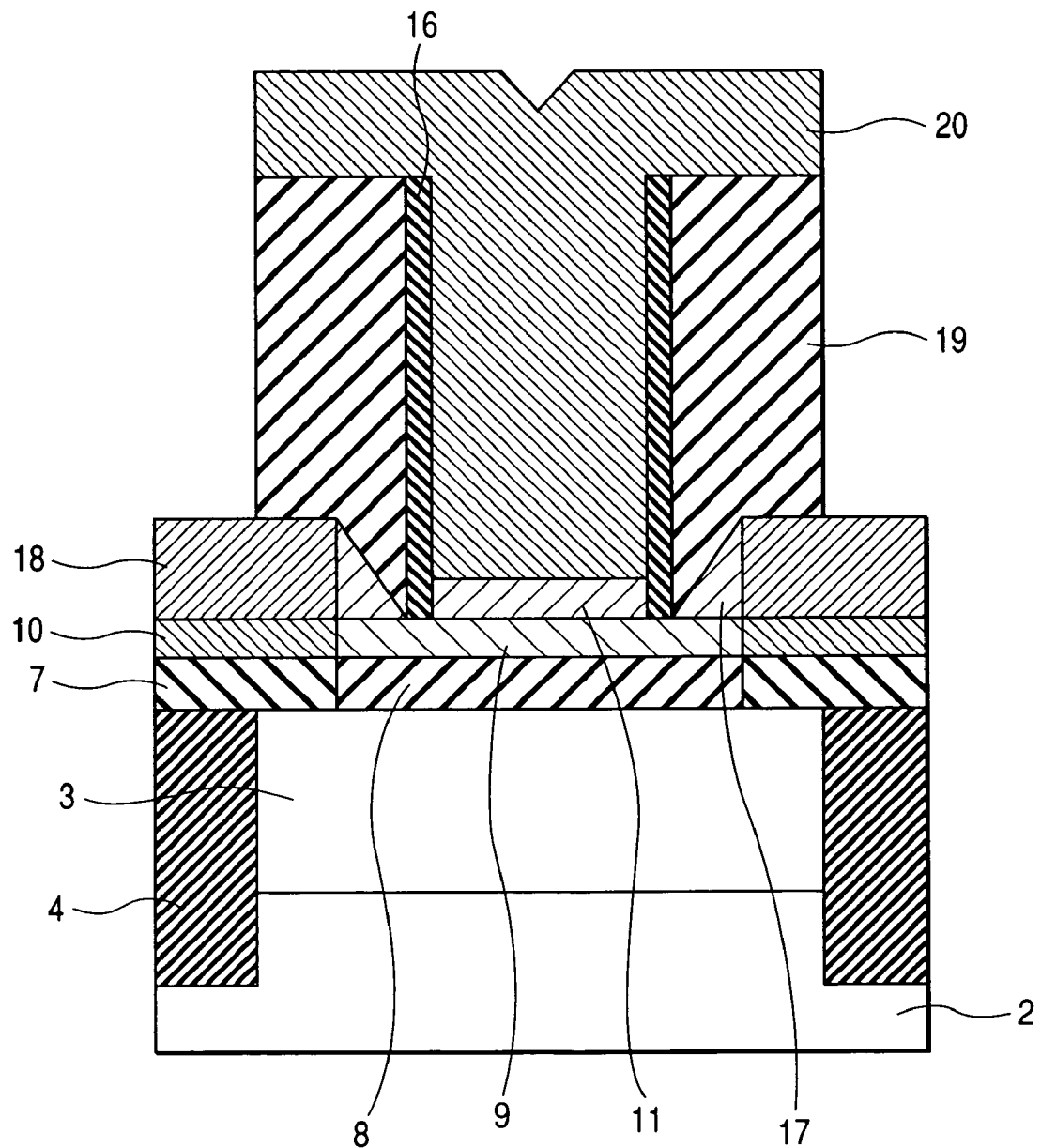
FIG. 7E is a partially expanded cross-section where a manufacturing process of an HBT of the present invention shown in FIG. 6 is shown in order.

After this, the highly-doped p-type poly-crystal Si layer 18 is removed except for the intrinsic region of the HBT and the surrounding area thereof, and an insulator film 19 is deposited on the entire surface of the substrate. Next, a structure shown in FIG. 7D is obtained by removing the insulator film 15 and the Si layer 14.

Moreover, after removing the insulator film 13, the highly-doped n-type poly-crystal Si layer 20 to be an emitter lead electrode is deposited. Finally, the aforementioned n-type poly-crystal Si layer 20 is removed except for the emitter lead electrode formation region and the surrounding area, resulting in a structure shown in FIG. 7E being achieved as an intrinsic region of the HBT in this embodiment.

Figure 8:
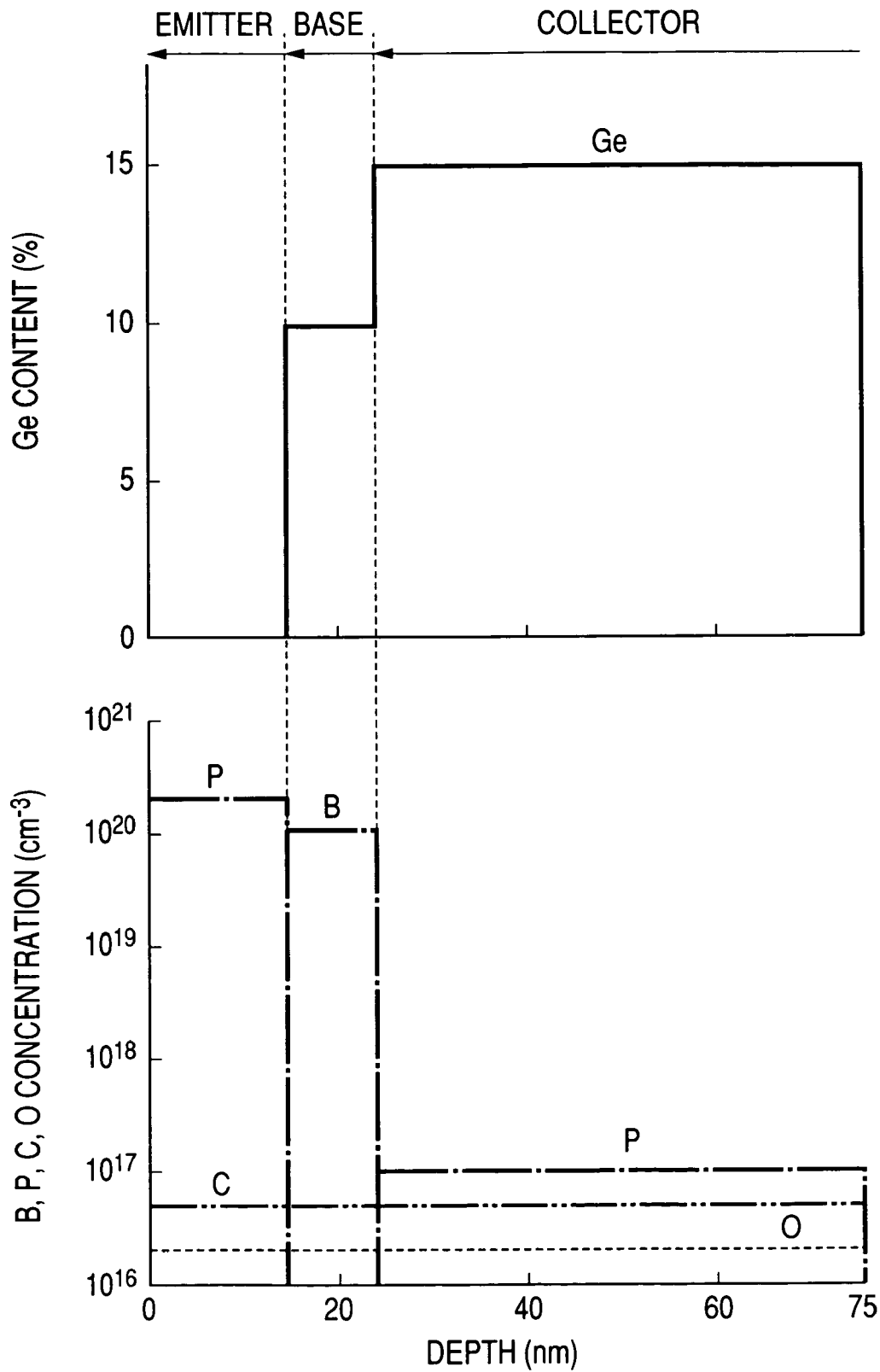
FIG. 8 is a drawing illustrating a profile at an intrinsic region of a SiGe HBT shown in FIG. 6.

According to this embodiment, as shown in FIG. 8, the contaminant concentration of oxygen and carbon can be suppressed to low levels at the interface of each layer of the multilayer film composed of the n-type single-crystal SiGe layer 8 to be a collector, the highly-doped p-type single-crystal SiGe layer 9 to be a base, and the highly-doped n-type single-crystal Si layer 11 to be an emitter. The upper drawing of FIG. 8 is a figure showing the concentration ratio of Ge (Ge content) at each part of a bipolar transistor, and the lower drawing shows a distribution of doping elements at each part of a bipolar transistor. The depth from the surface of the crystal is matched and shown in the upper and lower drawings.

In this embodiment, there is an advantage that the operation speed of the HBT is improved by reducing the base resistance and the emitter resistance because a multilayer film having excellent crystallinity is formed. Moreover, suppressing interface contamination is effective in reducing the leakage current, and 1/f noise is decreased by forming the single-crystal layer emitter, resulting in a high performance SiGe HBT being achieved.

Fourth Embodiment

Figure 9:
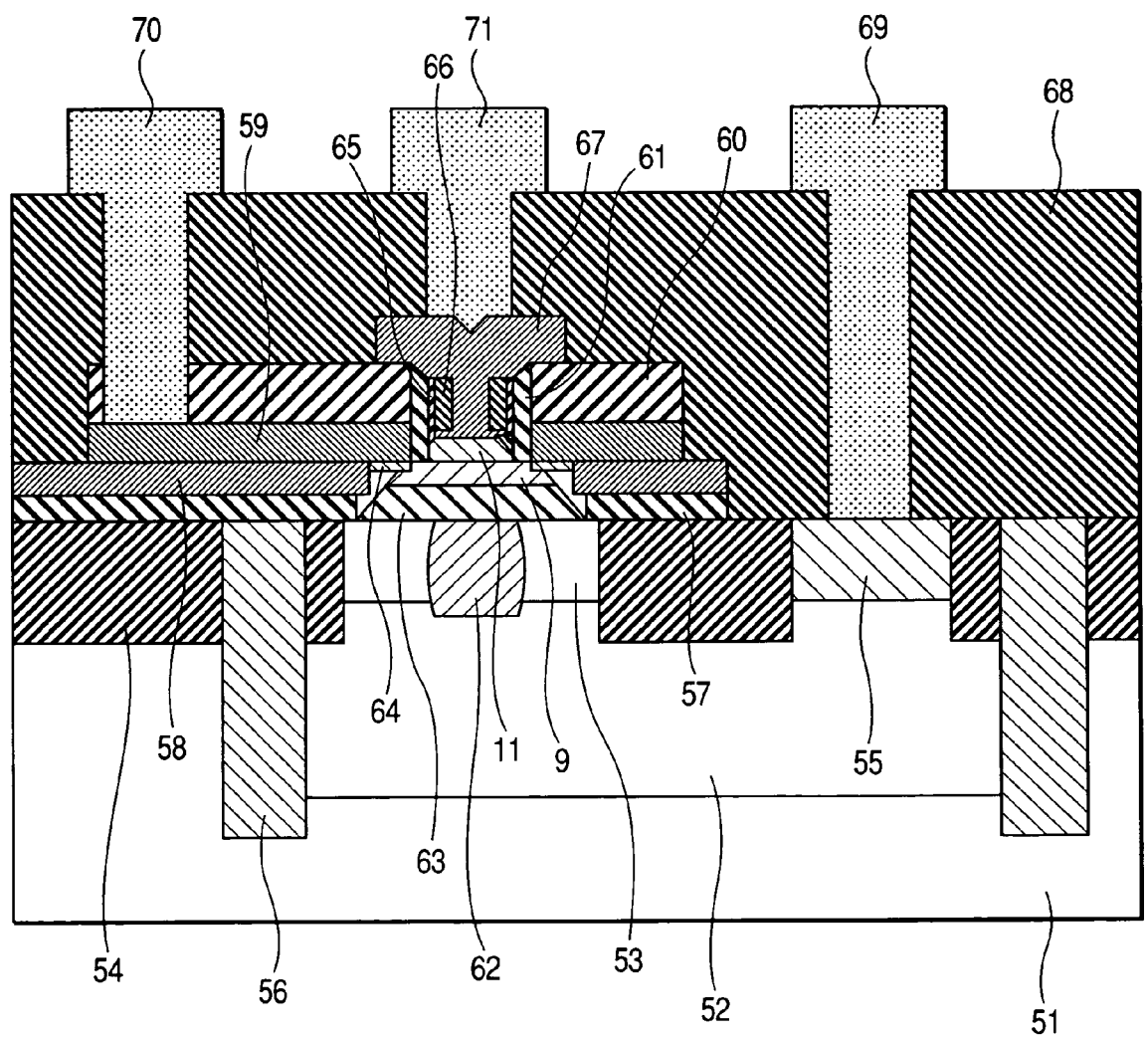
FIG. 9 is the fourth embodiment of a manufacturing process of a semiconductor device of the present invention and a longitudinal section of a SiGe HBT.

FIG. 9 is the fourth embodiment of a manufacturing method of a semiconductor device of the present invention and shows a longitudinal structure of a SiGe HBT. This embodiment is different from the structure of the HBT shown in the third embodiment from the viewpoint that the intrinsic region of the HBT is formed in a self-aligned condition. A semiconductor substrate comprising a highly-doped n-type single-crystal Si layer 52 to be a so-called buried layer, an n-type single crystal Si layer 53 to be a part of a collector, a first collector/base isolation insulator film 54, a highly-doped n-type single-crystal Si layer 55 to be a collector lead layer, and isolation insulator film 56 is formed on a Si substrate 51.

Then, a second collector/base isolation insulator film 57 and a third collector/base isolation insulator film 58 are formed on the surface of the substrate, except for the parts on which an intrinsic region of the HBT and a collector lead layer are formed. And a highly-doped p-type poly-crystal Si layer 59 to be a base lead layer is formed thereon and, moreover, an insulator film 60 is formed. An opening is formed at the part to form the intrinsic region of the HBT, and, after forming the first emitter/base isolation insulator film 61 on the sidewall, the n-type single-crystal Si layer 62 to be a highly-doped collector is formed at the bottom of the opening. In the region where the surface of the n-type single-crystal Si layer 53 at the bottom of the opening, an n-type single-crystal SiGe layer 63 to be a collector, a highly-doped p-type single-crystal SiGe layer 9 to be a base, and a highly-doped n-type single-crystal Si layer 11 to be an emitter are formed, in order, by selective epitaxial growth. Moreover, a highly-doped p-type poly-crystal SiGe layer 64 to be an external base is formed at the lower part of the highly-doped p-type poly-crystal Si layer 59 exposed to the opening while forming the highly-doped p-type single-crystal SiGe layer 9. Moreover, a second emitter/base isolation insulator film 65 and a third emitter/base isolation insulator film 66 are formed on the sidewall of the emitter. Furthermore, a highly-doped n-type poly-crystal Si layer 67 is formed as an emitter lead electrode and an insulator film 68 having openings is deposited on the entire surface of the substrate. Moreover, a corrector electrode 69, a base electrode 70, and an emitter electrode 71 composed of a metallic film are formed in the openings of the insulator film 68.

Next, FIGS. 10A to 10D show a flow of a manufacturing method to achieve an HBT having the structure shown in FIG. 9. These figures are main cross-sections in a manufacturing method of the HBT, and are longitudinal sections in the vicinity of the intrinsic region of the HBT.

The process for forming, from a highly-doped n-type single-crystal Si layer 52 which is a so-called buried layer to the isolation insulator film 56 on the Si substrate 51, is the same as the third embodiment, so that the explanations are omitted.

Figure 10A:
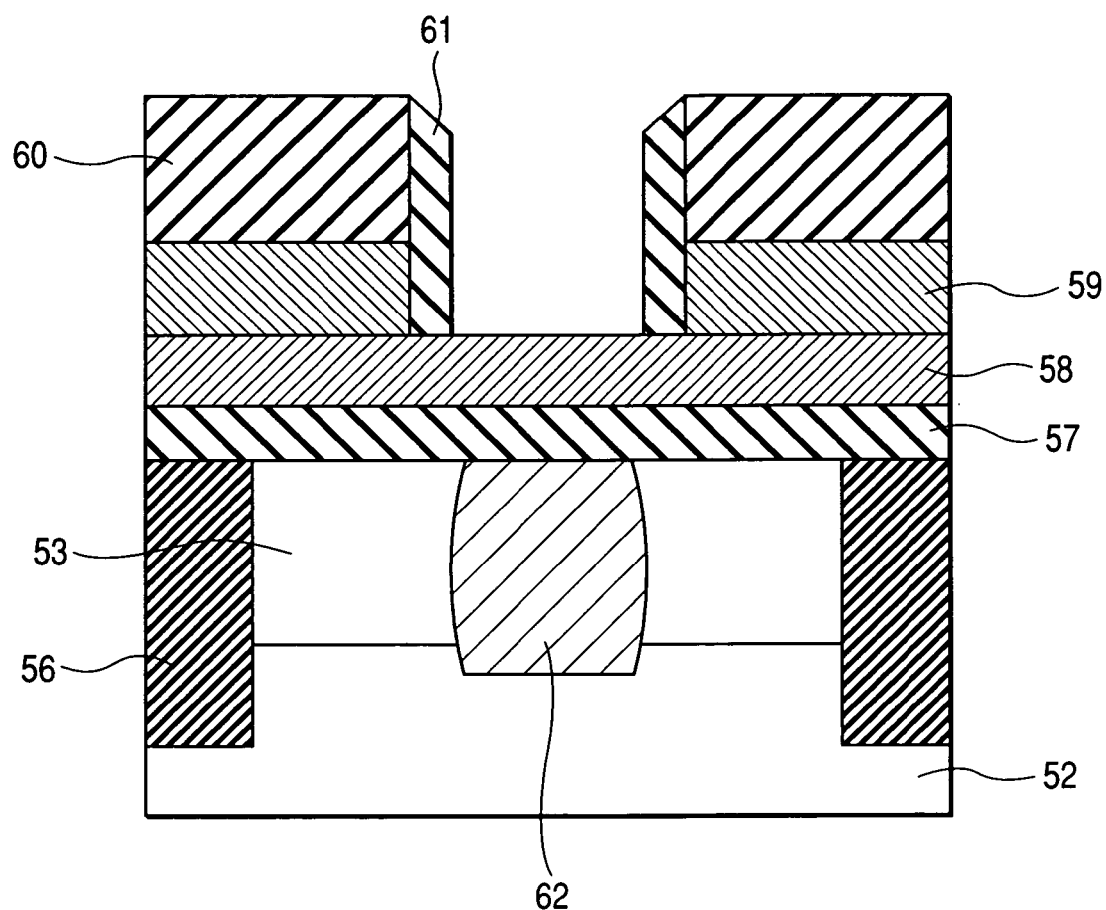
FIG. 10A is a partially expanded cross-section where a manufacturing process of an HBT of the present invention shown in FIG. 9 is shown in order.

Next, a second collector/base isolation insulator film 57 for which a Si oxide film is preferable and a third collector/base isolation insulator film 58 for which a Si nitride film is preferable are formed on the substrate. Moreover, a highly-doped p-type poly-crystal Si layer 59 to be a base lead layer and an insulator film 60 are deposited in order. After this, an opening is formed in the insulator film 60 and in the p-type poly-crystal Si layer 59 located at the part to form the intrinsic region of the HBT. Moreover, an emitter/base isolation insulator film 61 is formed on the sidewall of the opening, and then an n-type single-crystal Si layer 62 to be a highly-doped collector is formed in the opening by an ion implantation technique. At this time, the impurity concentration is preferably controlled to be about $1 \times 10^{18}$ cm$^{-3}$ to prevent increasing the transit time of electrons in the collector by expanding the depletion layer of the collector and decreasing the operation speed of the transistor. As a result, the structure shown in FIG. 10A is obtained.

Figure 10B:
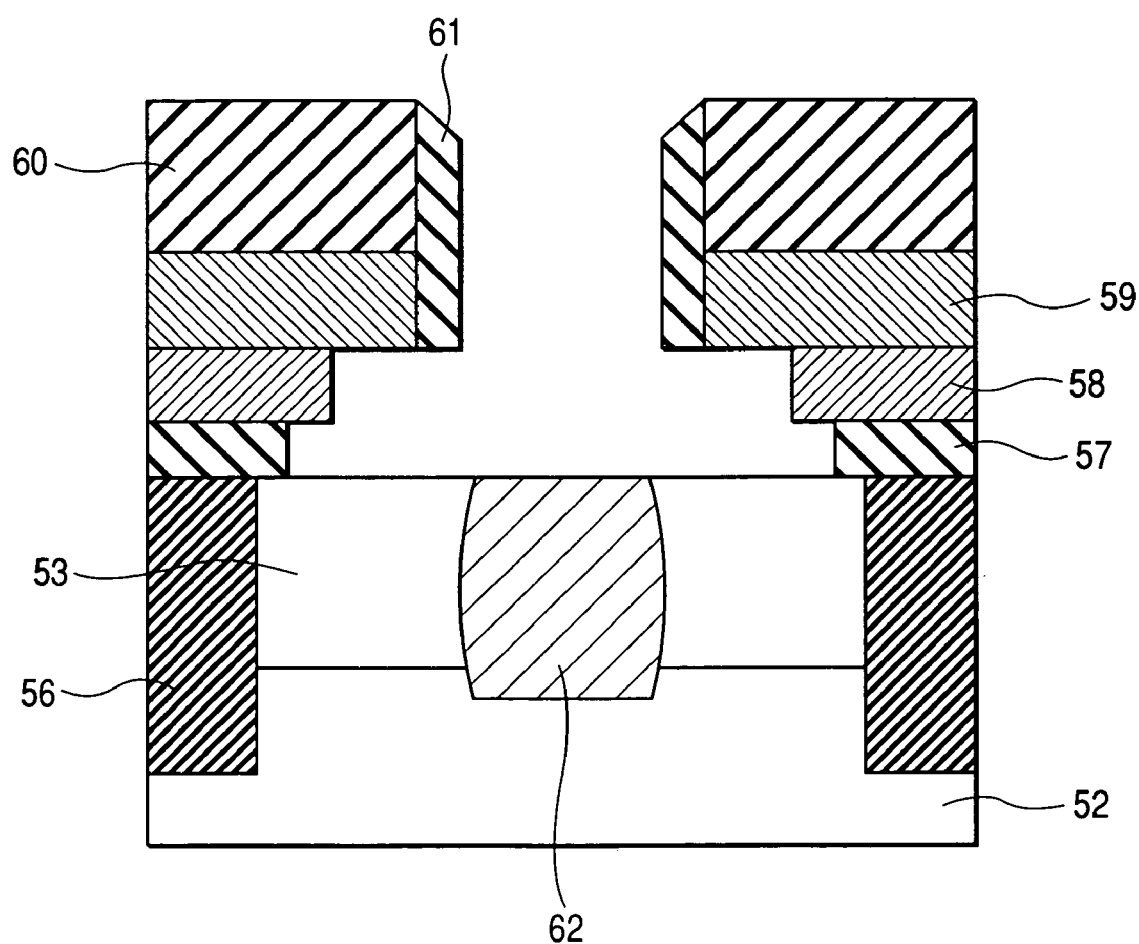
FIG. 10B is a partially expanded cross-section where a manufacturing process of an HBT of the present invention shown in FIG. 9 is shown in order.

Next, the third collector/base isolation insulator film 58 and the second collector/base isolation insulator film 57 are removed at the opening by, for instance, a wet-etching technique, resulting in the surface of the n-type single-crystal Si layer 53 being exposed. At this time, the lower surface of the base lead layer 59 is exposed at the same time. As a result, the structure shown in FIG. 10B is obtained.

Then, the substrate is cleaned by using the same method as the first embodiment and the third embodiment; the substrate is mounted in the semiconductor manufacturing apparatus, and the substrate is transferred to the second reactor explained in the first embodiment. After cleaning the substrate the same as in the first embodiment, waiting until the substrate temperature becomes stable at the growth temperature, an n-type single-crystal SiGe layer 63 to be a collector is selectively grown only at the opening. Since one can use a method of selective epitaxial growth in a similar manner to those explained in the previous embodiments, the explanations are omitted. The growth conditions only have to be ones in which an n-type poly-crystal SiGe layer is not grown at the surface of the poly-crystal Si layer exposed at the lower surface of the base lead layer 59. Additionally, the film thickness and the doping concentration of the n-type single-crystal SiGe layer 63, and the C additions are the same as the case of the n-type single-crystal SiGe layer 8 explained in the third embodiment.

Next, the substrate is transferred from the second reactor to the first reactor through the transfer chamber. Then, without particularly cleaning the substrate, a p-type single-crystal layer 9 to be a base is formed by a selective epitaxial growth. At this time, although one can use a growth method in a manner similar to that explained in the previous embodiments, the growth conditions have to be ones in which a poly-crystal layer is not grown on the insulator layer, and the highly-doped p-type poly-crystal SiGe layer 64 to be an external base is grown on the surface of the poly-crystal Si layer exposed at the lower surface of the base lead layer 59. For instance, one only has to increase the growth pressure when the highly-doped p-type single-crystal SiGe layer 9 is formed compared with that when the n-type SiGe single-crystal layer 63 is formed. Additionally, the film thickness and the Ge content of the highly-doped p-type single-crystal SiGe layer 9, the doping concentration, and the C addition are the same as those for the base layer explained in the third embodiment.

Figure 10C:
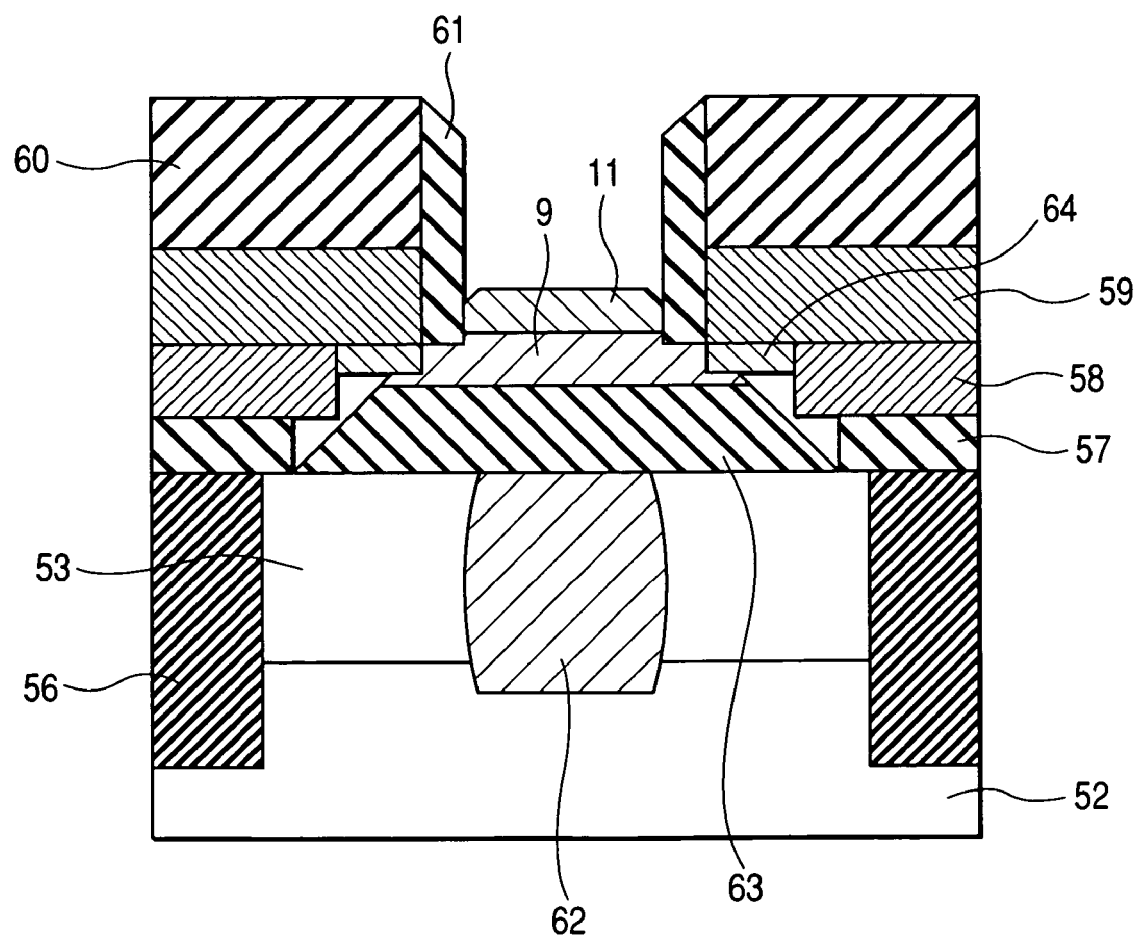
FIG. 10C is a partially expanded cross-section where a manufacturing process of an HBT of the present invention shown in FIG. 9 is shown in order.
Figure 10D:
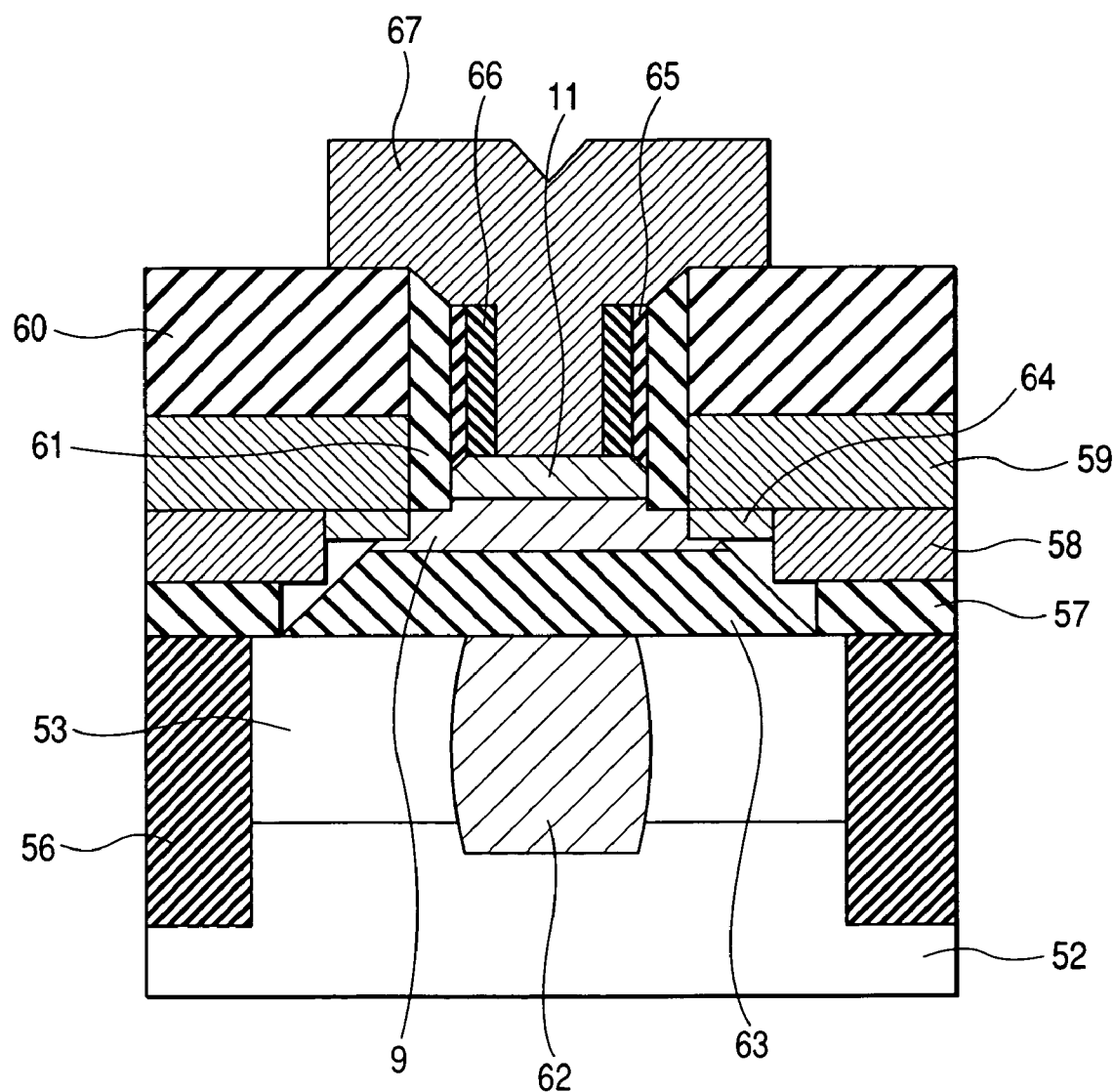
FIG. 10D is a partially expanded cross-section where a manufacturing process of an HBT of the present invention shown in FIG. 9 is shown in order.

Then, the substrate is transferred from the first reactor 100 to the second reactor 102 through the transfer chamber 101. Then, without particularly cleaning the substrate, an n-type single-crystal Si layer 11 to be an emitter is formed by selective epitaxial growth. At this time, one can use a growth method in a manner similar to one explained in the previous embodiments. However, the growth conditions have to be those in which a highly-doped n-type poly-crystal Si layer is not grown on the highly-doped p-type poly-crystal SiGe layer 64 to be an external base formed on the lower surface of the base leading layer 59. Additionally, the film thickness and the doping concentration of the highly-doped n-type single-crystal Si layer 11, and the C addition are the same as the case of the emitter layer explained in the third embodiment. As a result, the structure shown in FIG. 10C is obtained.

Next, a second emitter/base isolation insulator film 65 and a third emitter/base isolation insulator film 66 are formed, in order, on the sidewall of the opening. Then, a p-type poly-crystal Si layer 67 to be an emitter leading layer which contains P with high concentration is deposited, resulting in the intrinsic region of the SiGe HBT of this embodiment shown in FIG. 10D being obtained.

According to this embodiment, the same as FIG. 8 shown in the third embodiment, the contaminant concentration of oxygen and carbon can be suppressed to lower levels at the interfaces of base/collector and emitter/base. Accordingly, the same as the HBT of the third embodiment, there is an advantage that the operation speed of the HBT is improved by reducing the base resistance and the emitter resistance because a multilayer having excellent crystallinity is formed. Moreover, leakage current and 1/f noise are decreased, and, in this embodiment, the highly-doped p-type single-crystal SiGe layer 9 being the intrinsic base and the highly-doped p-type poly-crystal Si layer 59 being the base lead layer are connected in a self-aligned condition through the external base 64 composed of the highly-doped p-type poly-crystal SiGe layer. As a result, the parasitic resistance and the parasitic capacitance can be reduced. Therefore, formation of a high performance SiGe HBT is possible.

Fifth Embodiment

Figure 11:
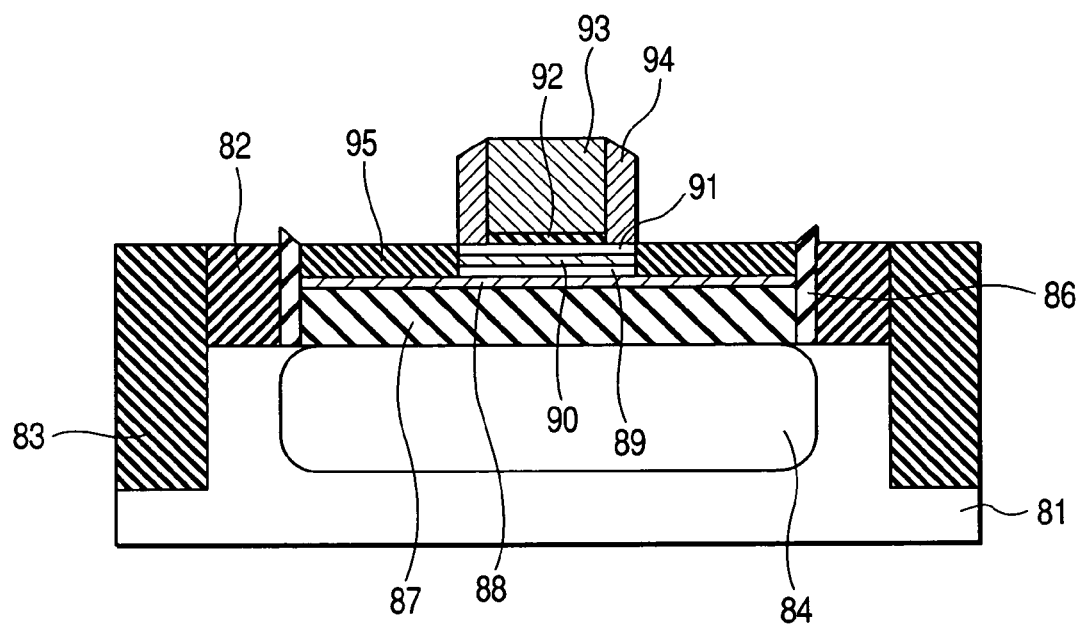
FIG. 11 is the fifth embodiment of a manufacturing process of a semiconductor device of the present invention and a longitudinal section of a MODFET.

FIG. 11 is the fifth embodiment of the present invention and a drawing illustrating a longitudinal structure of a pMODFET. An n-well 84 and a buffer layer 87 are formed on a Si substrate 81, and multilayer films 88, 89, 90, and 91 composed of single-crystal Si layers and single-crystal SiGe layers are continuously grown epitaxially thereon. Furthermore, a gate insulator film 92, a gate electrode 93, a source 95a, and a drain 95b are formed.

Next, FIGS. 12 A to 12D show a flow for fabricating a pMODFET having the structure shown in FIG. 11. These figures are typical cross-sections in a manufacturing method, and are longitudinal sections in the vicinity of the intrinsic region of the pMODFET.

Figure 12A:
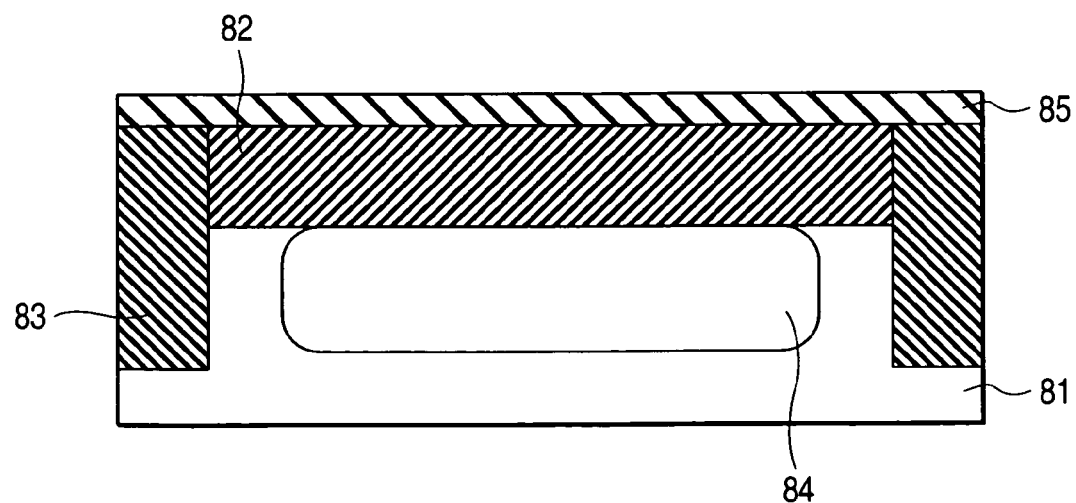
FIG. 12A is a partially expanded cross-section where a manufacturing process of a MODFET of the present invention shown in FIG. 11 is shown in order.

A field insulator film 82 is formed on a Si substrate 81, and an isolation insulator film 83 is formed. The isolation insulator film 83 may be a laminated film of an insulator film and a poly-crystal Si. Next, an insulator film 85 is formed on the entire surface of the substrate. Since this insulator layer 85 becomes a mask material for the selective epitaxial growth which is carried out later, a Si oxide film having large selectivity is preferable. The n-well 84 is formed by performing ion implantation of an n-type dopant selectively to the region where a pMODFET is formed. As a result, the structure shown in FIG. 12A is obtained.

Figure 12B:
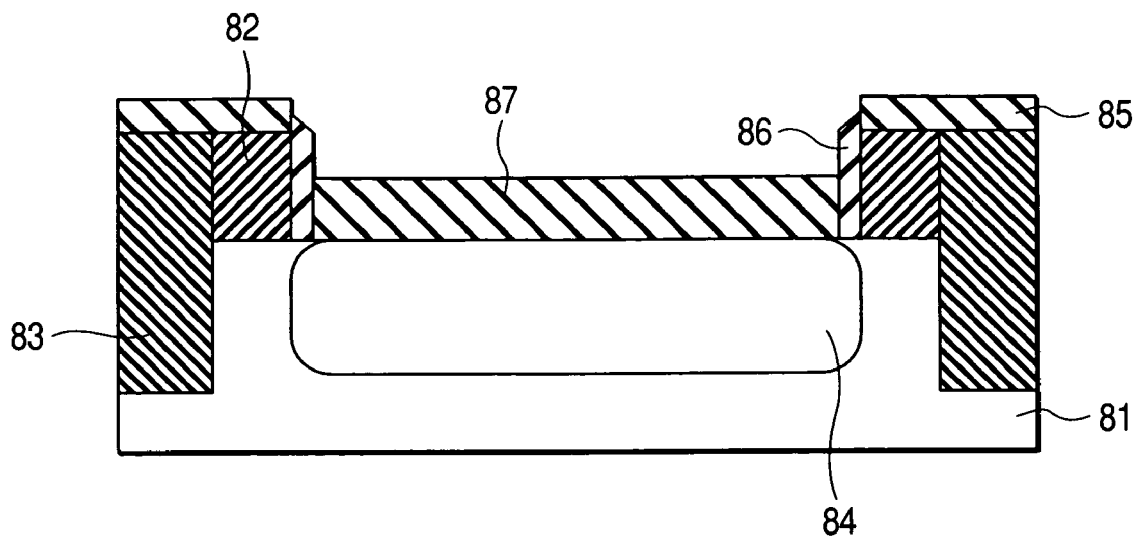
FIG. 12B is a partially expanded cross-section where a manufacturing process of a MODFET of the present invention shown in FIG. 11 is shown in order.

Next, in order to form the intrinsic region of the pMODFET, an opening is formed at the insulator film 85 and the field insulator film 82, and a Si nitride film 86 is selectively formed on the sidewall of the opening. After this, the buffer layer 87 composed of a single-crystal SiGe layer is selectively grown inside of the opening. One can use growth method and conditions in a manner similar to those shown in, for instance, the first embodiment. Here, selectivity becomes weaker compared with a Si oxide film because an opening of a Si nitride film 86 is formed on the Si substrate 81, so that a poly-crystal Si or a poly-crystal SiGe is easily deposited on the Si nitride. However, since a single-crystal Si layer or a single-crystal SiGe layer grows in contact with a Si nitride layer as epitaxial growth continues to proceed, it is possible to form a buffer layer 87, in which the creation of facets inside the openings is suppressed. Instead of forming the Si nitride film 86 on the sidewall, a field insulator film 82 may be formed. In the buffer layer 87, the Ge content is increased toward the surface from the Si substrate 81 side by using a Si nitride film. Therefore, because of the lattice strain involved in the buffer layer being relieved, a virtual substrate is formed in which the crystallinity at the surface is excellent and the lattice constant is the value of a single-crystal SiGe layer. For instance, if the Ge content is made to increase uniformly from the Si substrate 81 side toward the surface side, from 5% up to 30%, and if the film thickness of the buffer layer 87 is controlled to be about 1.5 µm, the lattice strain can be perfectly relieved inside. Moreover, when the Ge content is increased not uniformly but step-wise, the film thickness of the buffer layer 87 can be decreased, to about 1.0 µm, so that an excellent surface of the crystal can be obtained. As a result, the structure shown in FIG. 12B is obtained.

Figure 12C:
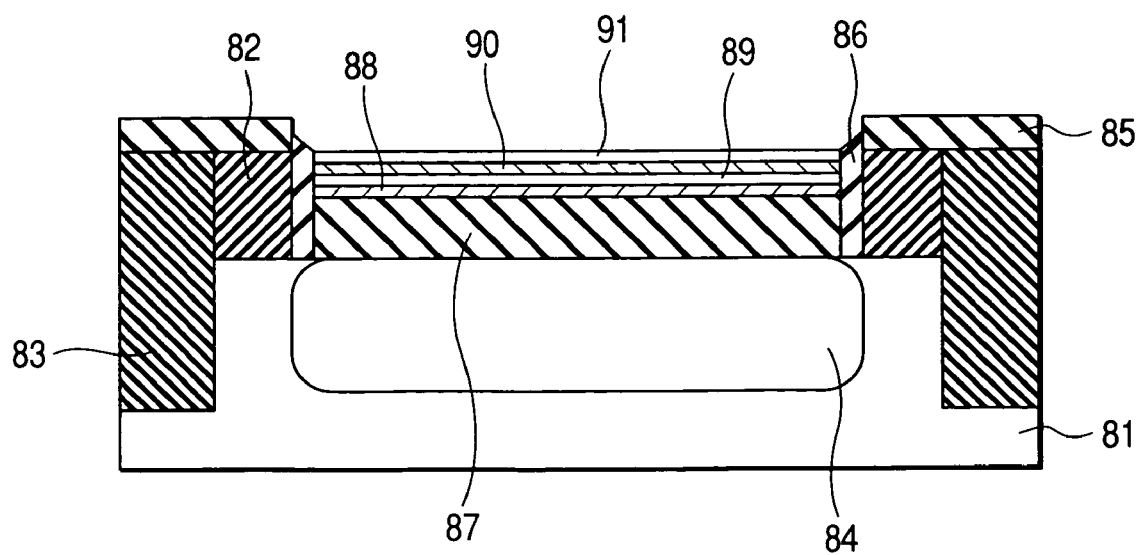
FIG. 12C is a partially expanded cross-section where a manufacturing process of a MODFET of the present invention shown in FIG. 11 is shown in order.

Next, the multilayer films 88, 89, 90, and 91 composed of the single-crystal Si and the single-crystal SiGe are grown epitaxially on the buffer layer 87. Here, one can use a growth method and conditions in a manner similar to those shown in, for instance, the first embodiment. At first, the substrate is transferred to the first reactor and a carrier supply layer 88 including a p-type dopant is formed by selective epitaxial growth on the buffer layer 87. One only has to make the Ge content of the carrier supply layer 88 same value as the surface side of the buffer layer 87 and the doping concentration $1 \times 10^{20}$ cm$^{-3}$ or less in order to suppress the diffusion to the channel layer. If the film thickness is preferably 1 nm or more, then the epitaxial growth is well controllable. Next the substrate is transferred from the first reactor 100 to the second reactor 102 through the transfer chamber 101. Then, without particularly cleaning the substrate, a spacer layer 89 is formed composed of single-crystal SiGe to be a barrier layer for carrier confinement. One only has to make the Ge content the same value as the surface side of the carrier supply layer 88 and the film thickness in the range from 1 nm where epitaxial growth is well controllable to 50 nm where carriers are supplied to the channel layer. N-type doping was carried out during growth in the second reactor 102 in prior arts previously described, but it is also possible that an un-doped layer such as the spacer layer 89 is formed by not flowing a doping gas. Moreover, similar statements can be made also for the first reactor. After this, the channel layer 90 composed of a single-crystal SiGe layer is formed in the same second reactor 102. The layer is made under a condition of compressive strain by controlling the Ge content to be greater than that of the spacer layer 89. For instance, the Ge content of the channel layer 90 is controlled to be 50% as opposed to the Ge content of 30% of the spacer layer 89. Accordingly, since the band of the valence band of the channel layer 90 is changed by receiving the compression strain, the energy for holes of the valence band in the channel layer 90 decreases, resulting in a quantum well structure being formed. Carriers supplied from the carrier supply layer 88 accumulate in this well layer and become a two-dimensional hole gas. One only has to control the film thickness of the channel layer 90 to be 1 nm or more where epitaxial growth is well controllable. After this, a cap layer 91 composed of single-crystal Si, which becomes a carrier barrier layer and protects the SiGe layer, is formed in the same second reactor 102. In order to control from the gate electrode, the film thickness is preferably from 1 nm where epitaxial growth is well controllable to 50 nm where carriers of the channel layer can be controlled. Herein, the mobility decreases when carriers in the channel are scattered by impurities, so that it is necessary that the concentration of dopant be lowered as much as possible. It is preferably $5 \times 10^{16}$ cm$^{-3}$ or less and $1.45 \times 10^{10}$ cm$^{-3}$ or more. As a result, the structure shown in FIG. 12C is obtained.

In this embodiment, the carrier supply layer 88 is provided between the channel layer 90 and the buffer layer 87. The carrier supply layer 88 may be provided at the surface side from the channel layer 90. In this case, the channel layer and the spacer layer are formed in the first reactor 100, then it is transferred to the second reactor 102, and the carrier supply layer and the cap layer are formed in the second reactor 102. Moreover, when these multilayer films are formed, it is assumed that the dopant concentration in the second reactor 102 is low enough.

Figure 12D:
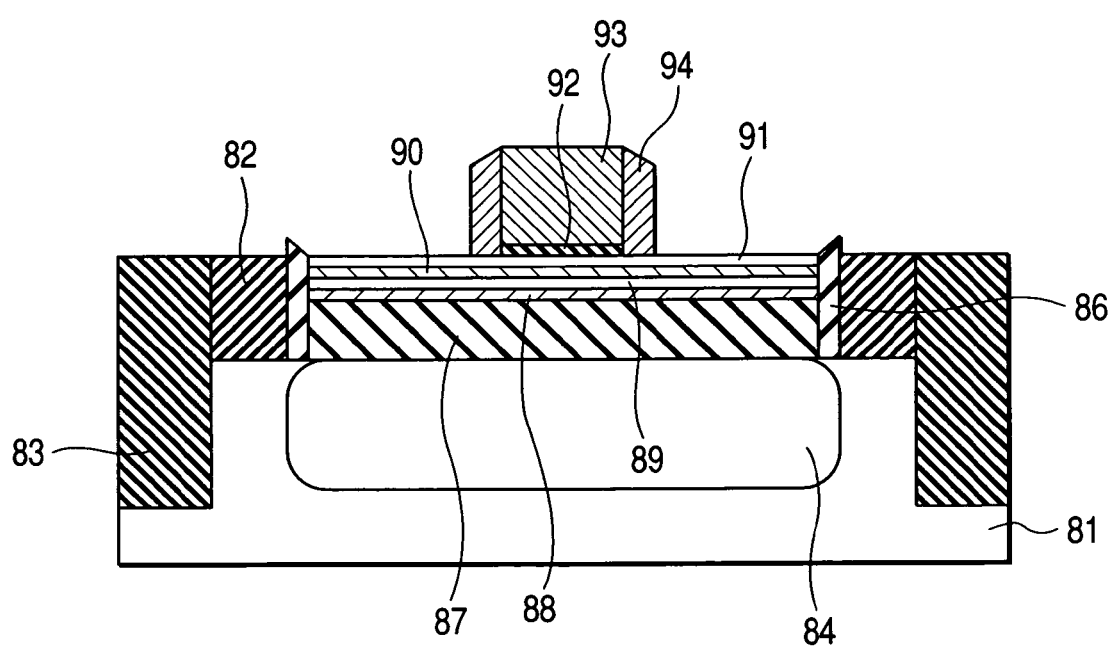
FIG. 12D is a partially expanded cross-section where a manufacturing process of a MODFET of the present invention shown in FIG. 11 is shown in order.
Figure 13:
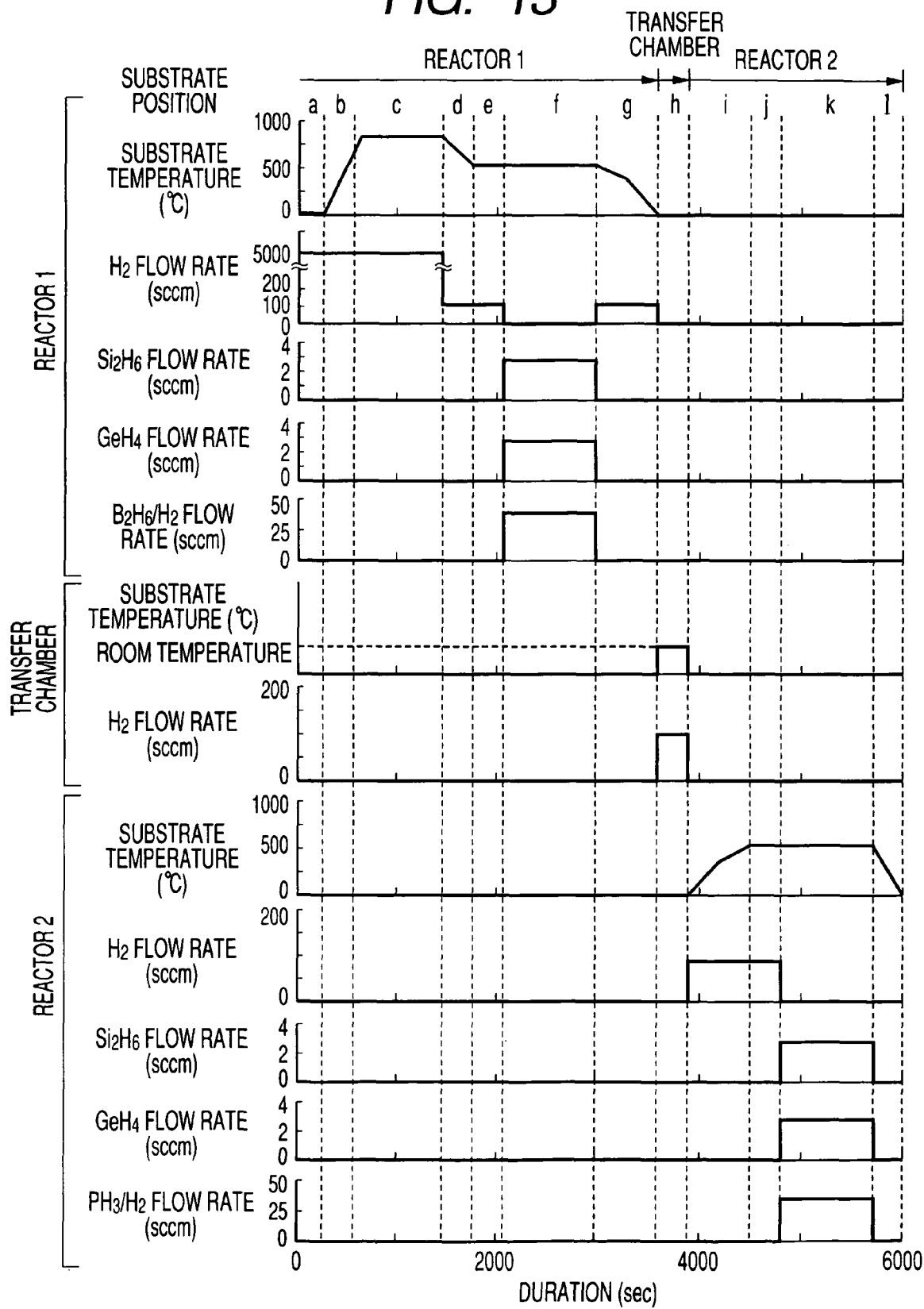
FIG. 13 is an embodiment of a manufacturing process of a semiconductor device of prior arts and a drawing illustrating a growth sequence.

Then, the gate insulator film 92 and the gate electrode 93 are formed, and the gate/source and gate/drain isolation insulator films 94 are formed on the sidewall of the gate electrode, resulting in the structure shown in FIG. 12D being obtained.

Finally, the source 95a and the drain 95b are formed by performing ion implantation of a p-type dopant selectively, resulting in the structure shown in FIG. 11 being obtained.

In this embodiment, a pMODFET and a manufacturing method thereof were described. However, the structure and the manufacturing method of an nMODFET which is the opposite conductive type can be treated the same as one of a pMODFET only by basically changing the doping from p-type to n-type.

According to this embodiment, the multilayer film is grown by transferring the substrate from the first reactor to the second reactor, so that a decrease in the dopant concentration and a reduction of the contaminants are achieved except for the carrier supply layer. Therefore, since the carriers are never scattered by an energy level and an interface state created by defects related to the interface contamination, a decrease in mobility and leakage currents are controlled and the noise characteristics can be improved.

Up to this point, the present invention was explained in detail and major embodiments will be enumerated as follows.

(1) A manufacturing method of a semiconductor device comprising at least a first process for forming a first semiconductor layer on a single-crystal substrate in a first reactor, a second process for transferring the substrate after the first process from the first reactor to a second reactor through a transfer chamber, and a third process for forming a second semiconductor layer on the first semiconductor layer in the second reactor after the second process. And, in the second process, hydrogen is supplied when the number of hydrogen atoms bonding with the surface atoms of the first semiconductor layer is less than the number of surface atoms of the first semiconductor layer, and the supply of hydrogen is stopped when the number of hydrogen atoms bonding with the surface atoms of the first semiconductor layer is greater than the number of surface atoms of the first semiconductor layer.

(2) A manufacturing method of a semiconductor device comprising at least a first process for forming a first semiconductor layer on a single-crystal substrate in a first reactor, a second process for transferring the substrate after the first process from the first reactor to the transfer chamber and returning the substrate from the transfer chamber to the first reactor, and a third process for forming a second semiconductor layer on the first semiconductor layer after the second process in the first reactor. And, in the second process, hydrogen is supplied when the number of hydrogen atoms bonding with the surface atoms of the first semiconductor layer is less than the number of surface atoms of the first semiconductor layer, and the supply of hydrogen is stopped when the number of hydrogen atoms bonding with the surface atoms of the first semiconductor layer is greater than the number of surface atoms of the first semiconductor layer.

(3) A manufacturing process of a semiconductor device described in the aforementioned (1) and (2), in which the number of hydrogen atoms bonding with the surface atoms of the first semiconductor layer becomes less than the number of the surface atoms of the first semiconductor layer, at a temperature of 250° C. or more and 500° C. or less.

(4) A manufacturing process of a semiconductor device described in the aforementioned (1) to (3), in which the number of hydrogen atoms bonding with the surface atoms of the first semiconductor layer becomes more than the number of the surface atoms of the first semiconductor layer at a temperature of 50° C. or more and 250° C. or less.

(5) A manufacturing process of a semiconductor device described in the aforementioned (1) to (4), in which a first conductive type first semiconductor layer is formed in the first process and a second conductive type second semiconductor layer having a conductive type opposite that of the first conductive type is formed in the third process.

(6) A manufacturing process of a semiconductor device described in the aforementioned (1) to (5), in which the single-crystal substrate contains Si or the sum of both Si and Ge as the main component.

(7) A manufacturing process of a semiconductor device described in the aforementioned (1) to (6), in which the first semiconductor layer contains Si or the sum of both Si and Ge as the main component.

(8) A manufacturing process of a semiconductor device described in the aforementioned (1) to (7), in which the second semiconductor layer contains Si or the sum of both Si and Ge as the main component.

(9) A manufacturing process of a semiconductor device described in the aforementioned (5) to (8), in which the impurity of the first conductive type is B and the impurity of the second conductive type is P or As.

(10) A manufacturing process of a semiconductor device described in the aforementioned (5) to (8), in which the impurity of the first conductive type is P or As and the impurity of the second conductive type is B.

(11) A manufacturing process of a semiconductor device described in the aforementioned (1) to (10), in which C is added in at least either the first semiconductor layer or the second semiconductor layer.

The following are various configurations of typical semiconductor devices.

(12) A semiconductor device comprising a first conductive type first semiconductor layer formed on a single-crystal substrate in which the doping concentration is $1 \times 10^{19}$ cm$^{-3}$ or more, and a second conductive type second semiconductor layer formed on the first semiconductor layer having a conductive type opposite that of the first conductive type in which the doping concentration is $1 \times 10^{19}$ cm$^{-3}$ or more, wherein both the oxygen concentration and the carbon concentration at the interface between the first semiconductor layer and the second semiconductor layer are about $1 \times 10^{19}$ cm$^{-3}$ or less.

(13) A semiconductor device comprising a first conductive type first semiconductor layer formed on a single-crystal substrate in which the doping concentration is $1 \times 10^{19}$ cm$^{-3}$ or more, and a second conductive type second semiconductor layer formed on the first semiconductor layer having a conductive type opposite that of the first conductive type in which the doping concentration is $5 \times 10^{17}$ cm$^{-3}$ or less, wherein both the oxygen concentration and the carbon concentration at the interface between the first semiconductor layer and the second semiconductor layer are about $1 \times 10^{19}$ cm$^{-3}$ or less.

In the aforementioned semiconductor device, for instance, in the case of an HBT, diffusion of electrons from the emitter to the collector is never controlled due to the reduction of the oxygen/carbon concentration at the heterojunction interface. Therefore, the performance of an HBT is improved by increasing the collector current and by improving the current gain. In the case of a MODFET, the mobility is improved by suppressing interface scattering when the oxygen/carbon concentration at the heterojunction interface decreases, resulting in the performance of the MODFET being improved. More concretely, the operation speed is improved.

According to the present invention, an improvement in the crystallinity is made possible in a multilayer film composed of a plurality of semiconductor layers by reducing the oxygen and carbon concentrations at the interface of each semiconductor layer by suppressing contamination during transfer of a substrate. It is needless to say that an improvement in various properties of the semiconductor device using the present invention depends on the design. For instance, it is possible to show as concrete examples, such improvement as an increase in the operation speed, suppression of the leakage current, reduction of l/f noise, etc. For instance, if a base composed of a highly-doped p-type single-crystal semiconductor layer and an emitter composed of a highly-doped n-type single-crystal semiconductor layer are formed in a SiGe HBT, not only is the operation speed drastically improved, but also the leakage current is suppressed and l/f noise is reduced. Therefore, it is not only possible to achieve an efficient HBT but also to make an efficient integrated circuit using it.

What is claimed is:

1. A manufacturing method of a semiconductor device comprising:
    a first process for forming a first semiconductor layer on a single-crystal substrate in a first reactor;
    a second process for transferring the substrate after said first process from the first reactor through a transfer chamber to a second reactor; and
    a third process for forming a second semiconductor layer on said first semiconductor layer after said second process in said second reactor,
    wherein, in said second process, hydrogen is supplied when the substrate temperature is higher than a predetermined substrate temperature which is determined based on a substrate temperature at which dihydride is formed instead of monohydride on a surface of said first semiconductor layer, and hydrogen stops being supplied and an ultra high vacuum condition is maintained when the substrate temperature is lower than the predetermined substrate temperature to maintain monohydride on the surface of said first semiconductor layer.

2. A manufacturing method of a semiconductor device according to claim 1, wherein in said third process, said second reactor is different from said first reactor.

3. A manufacturing method of a semiconductor device according to claim 1, wherein said second reactor is the same as the first reactor and said second process includes a process in which a substrate is transferred from the first reactor to the transfer chamber after said first process, and then the substrate is returned to said first reactor from said transfer chamber.

4. A manufacturing method of a semiconductor device according to claim 1, wherein in said second process, the supply of said hydrogen is performed at said substrate temperature of 250° C. or more.

5. A manufacturing method of a semiconductor device according to claim 1, wherein the supply of said hydrogen is stopped at said substrate temperature of 50° C. or more and less than 250° C.

6. A manufacturing method of a semiconductor device according to claim 1, wherein said single-crystal substrate is a semiconductor substrate in which the content of Si or the sum of both Si and Ge becomes the main component.

7. A manufacturing method of a semiconductor device according to claim 1, wherein said first semiconductor layer and said second semiconductor layer are semiconductor layers in which the content of Si or the sum of both Si and Ge becomes the main component.

8. A manufacturing method of a semiconductor device according to claim 1, wherein at least one of said first semiconductor layer and said second semiconductor layer contains carbon (C).

9. A manufacturing method of a semiconductor device according to claim 1, wherein said first semiconductor layer is a first conductive type semiconductor layer formed by epitaxial growth and said second semiconductor layer is a second conductive type semiconductor type semiconductor layer formed by epitaxial growth.

10. A manufacturing method of a semiconductor device according to claim 1, wherein said ultra high vacuum condition is lower than $1*10^{-5}$ Pa or less.

11. A manufacturing method of a semiconductor device according to claim 1, wherein one hydrogen atom bonds with one Si atom in monohydride and two hydrogen atoms bond with one Si atom in dihydride.

12. A manufacturing method of a semiconductor device according to claim 7, wherein at least one of said first semiconductor layer and said second semiconductor layer contains carbon (C).

13. A manufacturing method of a semiconductor device according to claim 9, wherein said epitaxial growth is performed by a CVD technique.

* * * * *